(12) United States Patent
Liu et al.

(10) Patent No.: US 8,056,253 B2
(45) Date of Patent: Nov. 15, 2011

(54) SYSTEMS AND METHODS FOR DRYING A ROTATING SUBSTRATE

(75) Inventors: Zhi (Lewis) Liu, Paoli, PA (US); Ismail Kashkoush, Orefield, PA (US); Hanjoo Lee, Sungname (KR)

(73) Assignee: Akrion Systems LLC

( * ) Notice: Subject to any disclaimer, the term of this patent is extended or adjusted under 35 U.S.C. 154(b) by 108 days.

(21) Appl. No.: 12/685,935

(22) Filed: Jan. 12, 2010
(Under 37 CFR 1.47)

(65) Prior Publication Data
US 2010/0293806 A1    Nov. 25, 2010

Related U.S. Application Data

(63) Continuation of application No. 11/624,445, filed on Jan. 18, 2007, now Pat. No. 7,644,512.

(60) Provisional application No. 60/839,487, filed on Aug. 23, 2006, provisional application No. 60/759,948, filed on Jan. 18, 2006.

(51) Int. Cl.
*F26B 19/00*    (2006.01)

(52) U.S. Cl. ........ 34/78; 34/80; 34/58; 34/218; 392/380; 392/384; 705/14; 428/195.1; 428/343; 118/666; 118/52; 526/243; 526/319

(58) Field of Classification Search ............... 34/60, 70, 34/80, 78, 58, 218, 242; 118/666, 52; 428/195.1, 428/343; 705/14; 392/380, 384; 526/245
See application file for complete search history.

(56) References Cited

U.S. PATENT DOCUMENTS

| | | | | |
|---|---|---|---|---|
| 3,151,950 A | * | 10/1964 | Newman et al. | 34/267 |
| 3,579,853 A | * | 5/1971 | Martino | 34/218 |
| 3,704,524 A | * | 12/1972 | Kamola et al. | 34/573 |
| 3,931,684 A | * | 1/1976 | Turnbull et al. | 34/242 |
| 4,013,038 A | * | 3/1977 | Rogers et al. | 118/666 |
| 4,100,340 A | * | 7/1978 | Waldmann et al. | 526/245 |
| 4,127,947 A | * | 12/1978 | Webb et al. | 34/92 |
| 4,143,471 A | * | 3/1979 | Wochnowski et al. | 34/475 |
| 4,182,046 A | | 1/1980 | Ludlow et al. | |
| 4,241,515 A | * | 12/1980 | Wochnowski et al. | 34/474 |
| 4,313,266 A | * | 2/1982 | Tam | 34/317 |
| 4,346,524 A | * | 8/1982 | Wochnowski et al. | 34/482 |
| 4,489,501 A | * | 12/1984 | Aigo | 34/317 |
| 4,525,938 A | * | 7/1985 | Aigo | 34/58 |
| 4,582,882 A | * | 4/1986 | Lynn et al. | 526/243 |
| 4,637,146 A | * | 1/1987 | Motoki et al. | 34/58 |
| 4,651,440 A | * | 3/1987 | Karl | 34/58 |
| 4,677,758 A | * | 7/1987 | Aigo | 34/58 |

(Continued)

FOREIGN PATENT DOCUMENTS

EP    261644 A1 *  3/1988

(Continued)

*Primary Examiner* — Stephen M. Gravini
(74) *Attorney, Agent, or Firm* — The Belles Group, P.C.

(57) ABSTRACT

A system of drying a surface of a substrate is provided. The system includes a rotary support for supporting a substrate; and an assembly comprising a first dispenser, a second dispenser, and a third dispenser, the assembly positioned above the surface of the substrate, the second and third dispensers positioned on the assembly adjacent to and in contact with one another and spaced from the first dispenser, the second dispenser having an opening that is larger than an opening of the third dispenser, and the second dispenser being located between the first and third dispensers; and means for translating the assembly generally parallel to the surface of the substrate.

7 Claims, 24 Drawing Sheets

U.S. PATENT DOCUMENTS

| | | | |
|---|---|---|---|
| 4,677,759 A * | 7/1987 | Inamura | 34/58 |
| 4,724,619 A * | 2/1988 | Poli et al. | 34/58 |
| 4,742,140 A | 5/1988 | Greenwood et al. | |
| 4,791,167 A * | 12/1988 | Saukaitis | 524/544 |
| 4,851,263 A * | 7/1989 | Ishii et al. | 438/760 |
| 4,980,435 A * | 12/1990 | Le | 526/245 |
| 4,989,345 A | 2/1991 | Gill, Jr. | |
| 5,055,538 A * | 10/1991 | Amimoto et al. | 526/245 |
| 5,120,506 A * | 6/1992 | Saito et al. | 422/66 |
| 5,173,547 A * | 12/1992 | Rottger et al. | 525/518 |
| 5,205,867 A * | 4/1993 | Ziger | 118/54 |
| 5,250,114 A * | 10/1993 | Konishi et al. | 118/321 |
| 5,279,045 A * | 1/1994 | Odashima et al. | 34/360 |
| 5,296,282 A * | 3/1994 | Evers | 428/195.1 |
| 5,300,358 A * | 4/1994 | Evers | 442/396 |
| 5,324,763 A * | 6/1994 | Rossler et al. | 524/368 |
| 5,359,787 A * | 11/1994 | Mostowy et al. | 34/343 |
| 5,416,047 A * | 5/1995 | Konishi et al. | 430/271.1 |
| 5,489,474 A * | 2/1996 | Shinoda et al. | 428/343 |
| 5,539,998 A * | 7/1996 | Mostowy et al. | 34/343 |
| 5,601,910 A * | 2/1997 | Murphy et al. | 442/79 |
| 5,607,341 A * | 3/1997 | Leach | 451/41 |
| 5,641,844 A * | 6/1997 | Thompson et al. | 526/245 |
| 5,663,288 A * | 9/1997 | Shinoda et al. | 528/354 |
| 5,702,290 A * | 12/1997 | Leach | 451/41 |
| 5,715,610 A * | 2/1998 | Smith et al. | 34/58 |
| 5,733,175 A * | 3/1998 | Leach | 451/41 |
| 5,745,946 A * | 5/1998 | Thrasher et al. | 15/77 |
| 5,762,084 A * | 6/1998 | Krusell et al. | 134/184 |
| 5,763,040 A * | 6/1998 | Murphy et al. | 428/96 |
| 5,778,554 A * | 7/1998 | Jones | 34/58 |
| 5,836,807 A * | 11/1998 | Leach | 451/41 |
| 5,884,412 A * | 3/1999 | Tietz et al. | 34/58 |
| 5,924,154 A * | 7/1999 | Gockel et al. | 15/77 |
| 5,953,827 A * | 9/1999 | Or et al. | 34/58 |
| 5,954,911 A * | 9/1999 | Bergman et al. | 156/345.29 |
| 5,960,555 A * | 10/1999 | Deaton et al. | 34/58 |
| 5,974,680 A * | 11/1999 | Anderson et al. | 34/58 |
| 5,974,681 A * | 11/1999 | Gonzalez-Martin et al. | 34/58 |
| 5,975,736 A * | 11/1999 | Simmons et al. | 700/3 |
| 5,985,444 A * | 11/1999 | Olson et al. | 428/357 |
| 6,012,470 A * | 1/2000 | Jones | 134/25.4 |
| 6,024,107 A * | 2/2000 | Jones | 134/104.1 |
| 6,029,369 A * | 2/2000 | Gonzalez-Martin et al. | 34/317 |
| 6,033,728 A * | 3/2000 | Kikuchi et al. | 427/240 |
| 6,087,000 A * | 7/2000 | Girgis et al. | 428/392 |
| 6,119,295 A * | 9/2000 | Gockel et al. | 15/77 |
| 6,131,307 A | 10/2000 | Komino et al. | |
| 6,153,675 A * | 11/2000 | Yamamoto et al. | 524/58 |
| 6,180,740 B1 * | 1/2001 | Fitzgerald | 526/245 |
| 6,207,026 B1 * | 3/2001 | Crocker | 204/192.12 |
| 6,213,136 B1 * | 4/2001 | Jones | 134/198 |
| 6,228,477 B1 * | 5/2001 | Klare et al. | 428/315.5 |
| 6,238,791 B1 * | 5/2001 | Schell et al. | 428/392 |
| 6,253,526 B1 * | 7/2001 | Murphy et al. | 52/741.4 |
| 6,261,676 B1 * | 7/2001 | Olson et al. | 428/221 |
| 6,353,051 B1 * | 3/2002 | Huang | 524/544 |
| 6,387,999 B1 * | 5/2002 | Dirschl et al. | 524/537 |
| 6,410,084 B1 * | 6/2002 | Klare et al. | 427/244 |
| 6,460,269 B2 * | 10/2002 | Cho et al. | 34/58 |
| 6,479,605 B1 * | 11/2002 | Franchina | 526/245 |
| 6,503,335 B2 * | 1/2003 | Hohl et al. | 134/33 |
| 6,566,470 B2 * | 5/2003 | Kantamneni et al. | 526/245 |
| 6,676,993 B2 * | 1/2004 | Klare | 427/245 |
| 6,742,279 B2 * | 6/2004 | Lubomirsky et al. | 34/317 |
| 6,754,980 B2 * | 6/2004 | Lauerhaas et al. | 34/594 |
| 6,776,602 B2 * | 8/2004 | Swanson et al. | 425/376.1 |
| 6,777,059 B2 * | 8/2004 | Kurian et al. | 428/91 |
| 6,818,717 B2 * | 11/2004 | Kantamneni | 526/245 |
| 6,824,612 B2 * | 11/2004 | Stevens et al. | 118/52 |
| 6,834,440 B2 | 12/2004 | Lee | |
| 6,854,603 B2 * | 2/2005 | Klare | 210/490 |
| 6,872,445 B2 * | 3/2005 | Vinod | 428/220 |
| 6,928,235 B2 * | 8/2005 | Pollack | 392/380 |
| 6,928,751 B2 * | 8/2005 | Hosack et al. | 34/594 |
| 6,988,326 B2 * | 1/2006 | O'Donnell et al. | 34/381 |
| 7,022,208 B2 * | 4/2006 | Davenport et al. | 162/358.2 |
| 7,037,440 B2 * | 5/2006 | Chrobaczek et al. | 252/8.61 |
| 7,053,148 B2 * | 5/2006 | Dirschl et al. | 524/588 |
| 7,065,900 B2 * | 6/2006 | Park et al. | 34/361 |
| 7,087,694 B2 * | 8/2006 | Juhue et al. | 526/243 |
| 7,093,375 B2 * | 8/2006 | O'Donnell | 34/79 |
| 7,100,304 B2 * | 9/2006 | Lauerhaas et al. | 34/312 |
| 7,138,014 B2 * | 11/2006 | Stevens et al. | 118/50 |
| 7,344,758 B2 * | 3/2008 | Franchina et al. | 427/372.2 |
| 7,363,727 B2 * | 4/2008 | O'Donnell | 34/380 |
| 7,374,712 B2 * | 5/2008 | Swanson et al. | 264/308 |
| 7,438,697 B2 * | 10/2008 | Campagna et al. | 602/8 |
| 7,470,638 B2 * | 12/2008 | Shirley et al. | 438/800 |
| 7,644,512 B1 * | 1/2010 | Liu et al. | 34/413 |
| 7,651,760 B2 * | 1/2010 | Gleason et al. | 428/292.1 |
| 7,652,112 B2 * | 1/2010 | Wang et al. | 526/319 |
| 7,723,417 B2 * | 5/2010 | Coppens et al. | 524/306 |
| 7,737,055 B2 * | 6/2010 | Shirley et al. | 438/800 |
| 7,893,014 B2 * | 2/2011 | van Buskirk et al. | 510/327 |
| 7,908,995 B2 * | 3/2011 | Inamasu et al. | 118/300 |
| 2002/0006275 A1 * | 1/2002 | Pollack | 392/380 |
| 2004/0045187 A1 * | 3/2004 | Curry et al. | 34/595 |
| 2004/0221473 A1 * | 11/2004 | Lauerhaas et al. | 34/255 |
| 2004/0231188 A1 * | 11/2004 | Lauerhaas et al. | 34/594 |
| 2005/0000110 A1 * | 1/2005 | Park et al. | 34/236 |
| 2005/0217135 A1 * | 10/2005 | O'Donnell et al. | 34/310 |
| 2006/0254078 A1 * | 11/2006 | O'Donnell | 34/351 |
| 2008/0040945 A1 * | 2/2008 | Buckner | 34/406 |
| 2008/0276482 A1 * | 11/2008 | Broughall et al. | 34/287 |
| 2008/0307668 A1 * | 12/2008 | Watterodt et al. | 34/282 |
| 2010/0293806 A1 * | 11/2010 | Liu et al. | 34/239 |

FOREIGN PATENT DOCUMENTS

| | | | | |
|---|---|---|---|---|
| EP | 360301 | A2 * | 3/1990 | |
| JP | 54112947 | A * | 9/1979 | |
| JP | 55043472 | A * | 3/1980 | |
| JP | 56017028 | A * | 2/1981 | |
| JP | 56118347 | A * | 9/1981 | |
| JP | 57168854 | A * | 10/1982 | |
| JP | 59132618 | A * | 7/1984 | |
| JP | 59218730 | A * | 12/1984 | |
| JP | 62081030 | A * | 4/1987 | |
| JP | 62274617 | A * | 11/1987 | |
| JP | 02303047 | A * | 12/1990 | |
| JP | 03186371 | A * | 8/1991 | |
| JP | 03255670 | A * | 11/1991 | |
| JP | 07029867 | A * | 1/1995 | |
| JP | 09223680 | A * | 8/1997 | |
| JP | 2001227868 | A * | 8/2001 | |
| JP | 2007184391 | A * | 7/2007 | |
| JP | 2008029922 | A * | 2/2008 | |

* cited by examiner

SYSTEMS AND METHODS FOR DRYING A ROTATING SUBSTRATE

CROSS-REFERENCE TO RELATED PATENT APPLICATIONS

The present application is a continuation of U.S. patent application Ser. No. 11/624,445, filed Jan. 18, 2007, now U.S. Pat. No. 7,644,512 the entirety of which is hereby incorporated by reference. The present application claims the benefit of U.S. Provisional Patent Application 60/839,487, filed Aug. 23, 2006, and U.S. Provisional Patent Application 60/759,948, filed Jan. 18, 2006 the entireties of which are hereby incorporated by reference.

FIELD OF INVENTION

The present invention relates generally to the field of drying rotating substrates, and specifically to drying systems and methods for removing liquids and/or contaminants from silicon wafer substrates during the manufacture of integrated circuits. The invention, however, can also be applied to the drying of raw wafers, lead frames, medical devices, disks and heads, flat panel displays, microelectronic masks, and other applications requiring high level cleanliness and/or drying during processing.

BACKGROUND OF THE INVENTION

In the manufacture of semiconductors, semiconductor devices are produced on thin disk-like substrates. Generally, each substrate contains a plurality of semiconductor devices. The exact number of semiconductor devices that can be produced on any single substrate depends both on the size of the substrate and the size of the semiconductor devices being produced thereon. As semiconductor devices have been becoming more and more miniaturized, the number of semiconductor devices capable of being produced for a given area increases. Thus, maximizing the useable surface area of a substrate becomes increasingly important.

In producing semiconductor devices, substrates are subjected to a multitude of processing steps before a viable end product can be produced. These processing steps include: chemical-etching, wafer grinding, photoresist stripping, and masking. These steps often require that each substrate undergo many cycles of cleaning, rinsing, and drying during processing so that particles that may contaminate and cause devices to fail are removed from the substrates. However, these rinsing and drying steps can introduce additional problems in and of themselves.

One major problem is the failure of the drying step to completely remove liquid from the substrates after rinsing (or any other processing step where the substrate is exposed to a liquid). If substrates are not dried properly, watermarks, which may contain small contaminating particles, may form on the surface, which can result in a drop in the yield of properly functioning devices and adversely affect the electrical characteristics of these devices. In fact, it is well known in the art that semiconductor devices produced from an area of the substrate where liquid droplets remain have a greater likelihood of failing. Thus, in order to increase the yield of properly functioning devices per substrate, it is imperative that all or substantially all liquid be removed from the substrate surface as completely as possible.

One well known method of drying semiconductor wafers is to utilize a drying vapor in combination with the liquid to be removed from the wafers. This drying process is commonly referred to throughout the art as "Marangoni Drying." "Marangoni Drying" utilizes the phenomena of surface tension gradient ("STG") to pull liquid from the surface of a wafer rather than allowing the liquid to evaporate. Removing liquid by evaporation is undesirable because the evaporated liquid tends to leave watermarks and residue/contaminants on the surface of the wafer.

During a conventional batch Marangoni Drying process, a plurality of substrates are immersed in a bath of liquid. A drying fluid, such as isopropyl alcohol ("IPA"), is provided atop the liquid bath. Because the IPA is miscible with the liquid, a meniscus forms as the liquid is drained past the substrates. The drying fluid is absorbed along the surface of the liquid, with the concentration of the absorbed vapor being higher at the tip of the meniscus than in the bulk of the liquid. The increased concentration of absorbed vapor results in the surface tension being lower at the tip of the meniscus than in the bulk of the liquid. This differential in surface tension causes the liquid to flow from the meniscus toward the bulk bath liquid as the substrates are withdrawn from the liquid bath. Such a flow is known as a "Marangoni" flow. This drying results in improved drying of substrates, eliminating watermarks and/or other contaminants on the substrate.

Recently, methods and systems for processing single substrates have become widely used. An example of a single-wafer cleaning system is disclosed in U.S. Pat. No. 6,039,059 to Bran, which issued on Mar. 21, 2000, the entirety of which is hereby incorporated by reference. Additionally, European Patent Application Publication EP0905747A1, to IMEC, which published on Mar. 31, 1999, the entirety of which is hereby incorporated by reference, discloses a single wafer drying apparatus that utilizes the Marangoni drying effect on a horizontally oriented rotating substrate (hereinafter referred to as "Rotagoni").

During a Rotagoni drying process, a liquid and drying fluid are applied to the surface of a substrate. More specifically, a dryer assembly that contains a DIW supply nozzle and an $N_2$/IPA supply nozzle is positioned above the surface of the substrate. Typically, both nozzles use a ⅛" PFA tube installed on the dryer assembly. The DIW nozzle is installed at approximately a 45° angle to the surface of the substrate while the $N_2$/IPA vapor nozzle is installed vertically to the surface of the substrate.

The drying assembly is swept from the substrate center to the substrate edge while the substrate is spinning. DIW and $N_2$/IPA vapor are applied through the nozzles during the sweeping process. The DIW nozzle is leads the $N_2$/IPA nozzle during the sweeping motion. The application of DIW rinses the substrate and keeps the substrate uniformly wet before being dried, thereby minimizing unwanted drying/evaporating on the substrate surface. The trailing $N_2$/IPA nozzle supplies $N_2$/IPA vapor in order to dry the wafer through STG. As a result of the IPA dissolving into the DIW, the $N_2$/IPA drying vapor reduces the surface tension of the DIW at the IPA/DIW boundary, thereby creating the Marangoni effect and reducing the tendency of the DIW to adhere to the substrate surface. The reduction in the tendency of the liquid to remain on the substrate surface minimizes unwanted evaporation because the DIW does not remain on the surface of the substrate long enough to evaporate.

The DIW applied to the substrate is pulled radially outward by the centrifugal force of the rotating substrate, pushed away by the convective force of the $N_2$/IPA vapor, and pulled by the STG effect formed by the IPA dissolving in the DIW at the IPA/DIW boundary. Continued rotation of the substrate combined with the continued outward sweeping of the dryer assembly, ultimately pulls the DIW off the entirety of the substrate. Therefore, the amount of residue left on the substrate is reduced.

Referring now to FIGS. 1A and 1B, a prior art Rotagoni drying system 1 is illustrated. The prior art Rotagoni drying system 1 comprises a dryer assembly 2 and arm 3. The dryer assembly 2 is positioned above a substrate 50 to be dried by the arm 3, which supports the dryer assembly 2 in a cantilevered fashion. During a Rotagoni drying process, the dryer assembly 2 is moved in the direction indicated by the arrow 7, which is generally parallel to the upper surface of the substrate 50 in a radially outward direction.

The dryer assembly 2 has first and second $N_2$/IPA vapor nozzles 5a, 5b extending from its housing. The dryer assembly 2 also comprises a DIW nozzle 4 coupled to the housing. The $N_2$/IPA nozzles 5a, 5b are aligned substantially perpendicular to the upper surface 51 of the substrate 50. The $N_2$/IPA nozzles 5a, 5b are both ⅛ inch tubes and are separated by about 1 inch. The DIW nozzle 4 is oriented at an approximately 45° angle to the substrate's 50 upper surface.

Referring to FIG. 2, a prior art Rotagoni drying method using the dryer assembly 2 of FIGS. 1A and AB is schematically illustrated. As the dryer assembly 2 is moved in direction 7, the DIW wetted area 8 becomes smaller as the dried area 9 becomes larger. The direction 7 is a movement radially outward from the center of the substrate 50. The STG effect is achieved by the IPA dissolving in the DIW at the IPA/DIW boundary 13.

Another prior art Rotagoni drying system and method is disclosed in U.S. Publication Number 2004/0020512 to Hosack et al., published Feb. 5, 2004, the entirety of which is hereby incorporated by reference.

As will be discussed below, existing Rotagoni drying systems and methods are less than optimal and suffer from a number of deficiencies, including the production of watermarks, long process times, decreases in device yield, and inadequate liquid removal, especially at the edge of the substrate.

SUMMARY OF THE INVENTION

It is therefore an object of the present invention to provide an improved system and method of drying a rotating substrate.

Another object of the present invention is to provide a system and method of drying a substrate that minimizes or eliminates waterspots.

Still another object of the present invention is to provide a system and method of drying a substrate that increases device yield from a semiconductor wafer.

Yet another object of the present invention is to provide a system and method of drying a substrate that reduces evaporation of the rinsing liquid.

A further object of the present invention is to provide a system and method of drying a substrate that more effectively dries an edge region of the substrate.

A yet further object of the present invention is to provide a system and method of drying a substrate that reduces and/or eliminates the negative effects caused by splash back.

A still further object of the present invention is to provide a system and method of drying a substrate that dries a substrate in an acceptable process time for integrated circuit manufacture.

These and other objects are met by the present invention. As will be detailed below, a number of process variables and hardware deficiencies of existing Rotagoni drying systems and methods have been discovered through experimentation.

As a result of the discovery of the source of these deficiencies in the prior art, the present invention implements a novel hardware design for the drying assembly and/or a number of novel process parameters/steps that eliminate the discovered deficiencies. As will be understood by those skilled in the art, any of the inventive hardware aspects and/or process parameters can be combined in a single system/method or can be implemented separately if desired.

In one aspect, the invention is a method of drying a surface of a substrate comprising: a) supporting the substrate in a substantially horizontal orientation; b) rotating the substrate; c) positioning an assembly comprising a first dispenser, a second dispenser, and a third dispenser above the surface of the substrate, the first dispenser operably coupled to a source of liquid and the second and third dispensers operably coupled to a source of drying fluid, the second and third dispensers positioned on the assembly adjacent one another and spaced from the first dispenser, the second dispenser having a larger opening than the third dispenser, and the second dispenser being located between the third dispenser and the first dispenser; d) supplying a film of the liquid to the surface of the substrate with the first dispenser; e) supplying a drying fluid to the surface of the substrate with the second and third dispensers; and f) moving the assembly toward an edge of the substrate while continuing to supply the liquid and drying fluid to the surface of the substrate, the first dispenser leading the second and third dispensers during said movement.

In another aspect, the invention can be a system for drying a surface of a substrate comprising: a rotary support for supporting a substrate; an assembly comprising a first dispenser, a second dispenser, and a third dispenser, the assembly positioned above the surface of the substrate, the second and third dispensers positioned on the assembly adjacent one another and spaced from the first dispenser, the second dispenser having an opening that is larger than an opening of the third dispenser, and the second dispenser being located between the first and third dispensers; and means for translating the assembly generally parallel to the surface of the substrate.

In yet another aspect, the invention can be a method of drying a surface of a substrate comprising: a) supporting a substrate; b) rotating the substrate; c) applying a liquid film to the surface of the substrate using a first dispenser; d) providing a second dispenser fluidly coupled to a source of drying fluid with a supply line, a proportional valve operably coupled to the supply line between the second dispenser and the source of drying fluid; e) gradually opening the proportional valve from a closed position to an open position so that drying fluid is applied to the surface of the substrate in manner free of pressure spikes.

In still another aspect, the invention can be a system for drying a surface of a substrate comprising: a rotary support; a first dispenser fluidly coupled to a source of liquid, the first dispenser positioned above the surface of the substrate so as to be capable of applying a film of the liquid to the surface of the substrate; a second dispenser fluidly coupled to a source of drying fluid with a supply line, the second dispenser positioned above the surface of the substrate so as to be capable of applying the drying fluid to the surface of the substrate; and a proportional valve operably coupled to the supply line between the second dispenser and the source of drying fluid, the proportional valve capable of being incrementally adjusted from a closed position to an open position.

In a further aspect, the invention can be a method of drying a surface of a substrate comprising: a) supporting a substrate; b) rotating the substrate; c) positioning an assembly having a pivotably mounted liquid dispenser and a drying fluid dispenser above the surface of the substrate, the assembly comprising indicia means for indicating an angle at which the liquid dispenser is oriented with respect to the surface of the substrate; d) adjusting the angle at which the liquid dispenser is oriented with respect to the surface of the substrate using the indicia means until a desired angle is achieved; e) applying a film of liquid on the surface of the substrate with the liquid dispenser; and f) applying a drying fluid to the surface of the substrate with the drying vapor dispenser in a manner to remove the liquid from the surface of the utilizing surface tension gradient.

In a yet further aspect, the invention can be an apparatus for drying a surface of a substrate comprising: an assembly having a pivotably mounted liquid dispenser and a drying fluid dispenser, the assembly adapted to be supported above the surface of the substrate; and indicia means on the assembly for indicating an angle at which the liquid dispenser is oriented with respect to the surface of the substrate when the assembly is supported above the surface of the substrate.

In a still further aspect, the invention can be a system for drying a surface of a substrate comprising: a rotary support; an assembly having a pivotably mounted first dispenser and a second dispenser, the assembly supported above the surface of the substrate; indicia means on the assembly for indicating an angle at which the first dispenser is oriented with respect to the surface of the substrate; and means for translating the assembly in a direction substantially parallel to the surface of the substrate.

In another aspect, the invention can be a method of drying a surface of a substrate comprising: a) supporting a substrate; b) rotating the substrate; c) applying a film of liquid to the surface of the substrate; d) applying a drying fluid to the surface of the substrate in a manner to remove the film of liquid from the surface using surface tension gradient, the liquid being pulled off the surface via centrifugal force; and e) positioning a splash guard around an edge of the substrate to aid in minimizing splash-back, wherein the splash guard comprises a hydrophobic material.

In yet another aspect, the invention can be a system for drying a surface of a substrate comprising: a rotary support for supporting a substrate in a substantially horizontal orientation within a process chamber; means for applying a film of liquid to the surface of the substrate; means for applying a drying fluid to the surface of the substrate; an assembly; a splash-guard surrounding at least a portion of the periphery of the substrate, the splash guard comprising a hydrophobic material.

In still another aspect, the invention can be a method of drying a surface of a substrate comprising: a) supporting a substrate; b) rotating the substrate; c) applying a liquid to the surface of the substrate at or near a rotational center point via a liquid dispenser so that a film of the liquid is formed on the surface of the substrate; d) applying a drying fluid to the substrate at a distance from the rotational center point via a drying fluid dispenser; e) manipulating the drying fluid dispenser so that the location at which the drying fluid is applied to the substrate is moved in a direction toward the rotational center point; and f) manipulating the liquid dispenser so that the location at which the liquid is applied to the substrate is moved in a direction outward from the rotational center point while performing step e).

In a further aspect, the invention can be a method of drying a surface of a substrate comprising: a) supporting a substrate having a surface in a substantially horizontal orientation; b) rotating the substrate about a rotational center point while maintaining the substantially horizontal orientation; c) positioning an assembly having a first dispenser and a second dispenser above the substrate, the first dispenser being positioned substantially above the rotational center point and the second dispenser being positioned above the substrate at a distance from the rotational center point; d) applying a liquid to the surface of the substrate at the rotational center point via the liquid dispenser so that a film of the liquid is formed on the entire surface of the substrate; e) applying a drying fluid to the substrate at a distance from the rotational center point via a drying fluid dispenser; 0 moving the assembly toward an edge of the substrate so that (1) the liquid dispenser moves from the rotational center point toward an edge of the substrate, and (2) the drying fluid dispenser moves toward the rotational center point, passes through the rotational center point, and moves toward the edge of the substrate.

In a yet further aspect, the invention can be a system for drying a surface of a flat substrate comprising: a rotary support for supporting a flat substrate in a substantially horizontal orientation and rotating the substrate about a rotational center point; an assembly comprising a first dispenser operably coupled to a source of drying fluid and a second dispenser operably coupled to a source of liquid, the assembly supported above a substrate positioned on the support and movable in a direction substantially parallel to the surface of the substrate; and a controller operably coupled to the assembly for facilitating and controlling movement of the assembly, the controller programmed to (1) position the assembly above the substrate so that the first dispenser is positioned to dispense liquid onto the substrate at the rotational center point and the second dispenser is positioned to dispense drying fluid onto the substrate at a distance from the rotational center point, and (2) move the assembly in a direction toward an edge of the substrate so that the first dispenser moves outward from the rotational center point while the second dispenser moves toward the rotational center point, passes through the rotational center point, and then moves outward from the rotational center point.

In a still further aspect, the invention can be a method of drying a surface of a substrate comprising: a) supporting a substrate; b) rotating the substrate about a rotational center point; c) applying a liquid to the surface of the substrate via a liquid dispenser so that a film of the liquid is formed on the surface of the substrate; d) applying a drying fluid to the substrate via a drying fluid dispenser at a location on the substrate that is radially closer to the rotational center point than a location at which the liquid dispenser applies the liquid; e) manipulating the drying fluid dispenser and the liquid dispenser so that the locations at which the drying fluid and the liquid are applied to the substrate are both moved in a direction toward an edge of the substrate, the drying fluid being applied closer to the rotational center point than the liquid during the manipulation; and f) upon the liquid being applied at or near the edge of the substrate, discontinuing application of the liquid while continuing the manipulation of the drying fluid dispenser toward the edge of the substrate; and g) upon the drying fluid being applied to at or near the edge of the substrate, maintaining the arrangement of the drying fluid dispenser so that the drying fluid is applied at or near the edge of the substrate for a predetermined period of time.

In another aspect, the invention can be a system for drying a surface of a thin flat substrate comprising: a rotary support for supporting a substrate in a substantially horizontal orientation and rotating the substrate about a rotational center point; an assembly comprising a first dispenser operably coupled to a source of drying fluid and a second dispenser operably coupled to a source of liquid, the assembly supported above a substrate positioned on the support and movable in a direction substantially parallel to the surface of the substrate; and a controller operably coupled to the assembly for facilitating and controlling movement of the assembly, the controller programmed to (1) position the assembly above the substrate so that the first dispenser dispenses liquid onto the substrate and the second dispenser dispenses drying fluid onto the substrate, (2) move the assembly toward an edge of the substrate so that the locations at which the drying fluid and the liquid are applied to the substrate are both moved in a direction toward an edge of the substrate, the drying fluid being applied closer to the rotational center point than the liquid during the manipulation, (3) upon the liquid being applied at or near the edge of the substrate, discontinuing application of the liquid while continuing the manipulation of the drying fluid dispenser toward the edge of the substrate, and (4) upon the drying fluid being applied to at or near the edge of the substrate, maintaining the assembly in place so that the drying fluid is applied at or near the edge of the substrate for a predetermined period of time.

In yet another aspect, the invention can be a method of drying a surface of a substrate comprising: a) supporting a substrate; b) rotating the substrate; c) applying liquid to a first surface and a second surface of the substrate while rotating the substrate so that a film of the liquid is formed on the first and second surfaces; d) discontinuing application of the liquid to the second side of the substrate so that substantially all of the liquid is spun off the second side while maintaining the film of the liquid on the first surface; and e) applying a drying fluid to the substrate in a manner that removes the liquid from the first surface of the substrate by way of surface tension gradient.

In still another aspect, the invention can be a system for drying a substrate comprising: a rotary support for supporting a substrate in a substantially horizontal orientation; means for applying a drying fluid to a first surface of a substrate positioned on the support; means for applying a film of liquid to a first surface of a substrate positioned on the support; means for applying a film of liquid to a second surface of a substrate positioned on the support; a controller operably coupled to the means for applying a drying fluid, the means for applying the film of liquid to the first surface of the substrate, and the means for applying the film of liquid to the second surface of the substrate; and the controller adapted to (1) apply the films of liquid to the first and second surfaces of the substrate while the substrate is rotating, (2) discontinue application of the liquid to the second surface of the substrate so that substantially all of the liquid is spun off the second surface while continuing to apply the film of the liquid on the first surface, and (3) apply the drying fluid to the first surface of the substrate to remove the liquid from the first surface of the substrate by way of surface tension gradient.

In a further aspect, the invention can be a method of drying a surface of a substrate comprising: a) supporting a substrate; b) rotating the substrate; c) applying a film of liquid to the surface of the substrate while rotating the substrate; d) applying a drying fluid to the substrate in a manner that removes the liquid from the surface of the substrate by way of surface tension gradient while rotating the substrate at a rotational speed between 1000 and 1500 RPM. In a final aspect, the invention can be system for performing this method.

DETAILED DESCRIPTION OF THE DRAWINGS

It has been discovered through experimentation that prior art Rotagoni drying systems and methods result in at least two regions of a substrate being dried by non-STG drying (i.e., evaporation). The first problem area is located near the center region of the substrate. The second problem area is located near the edge region of the substrate. The mechanisms responsible for the non-STG drying within both of these regions will be discussed in turn below.

Figure 3:
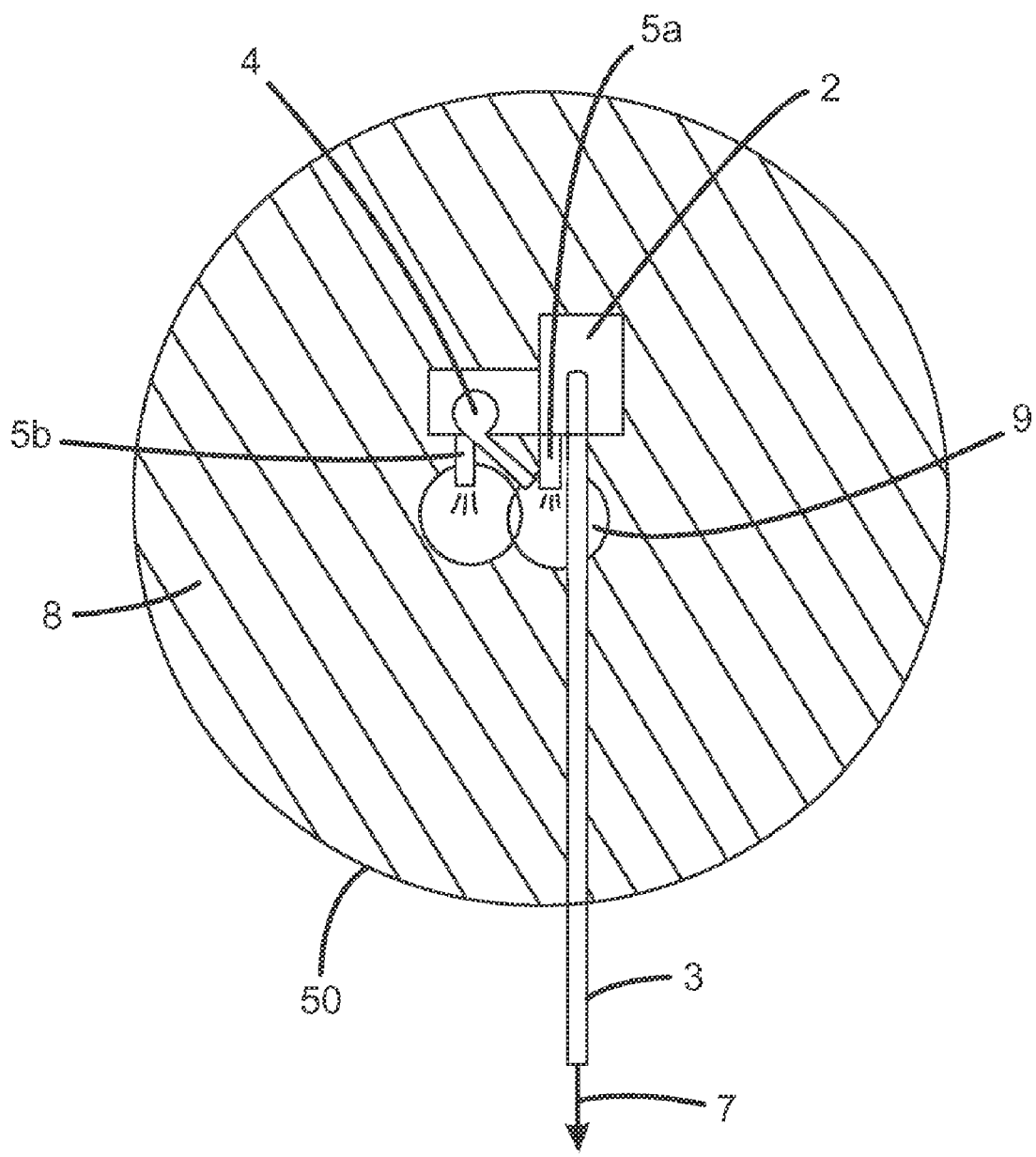
FIG. 3 is a schematic illustrating an evaporation zone that was discovered to be formed when using the prior art dryer assembly of FIG. 1A according to the prior art drying method of FIG. 2.
Figure 4:
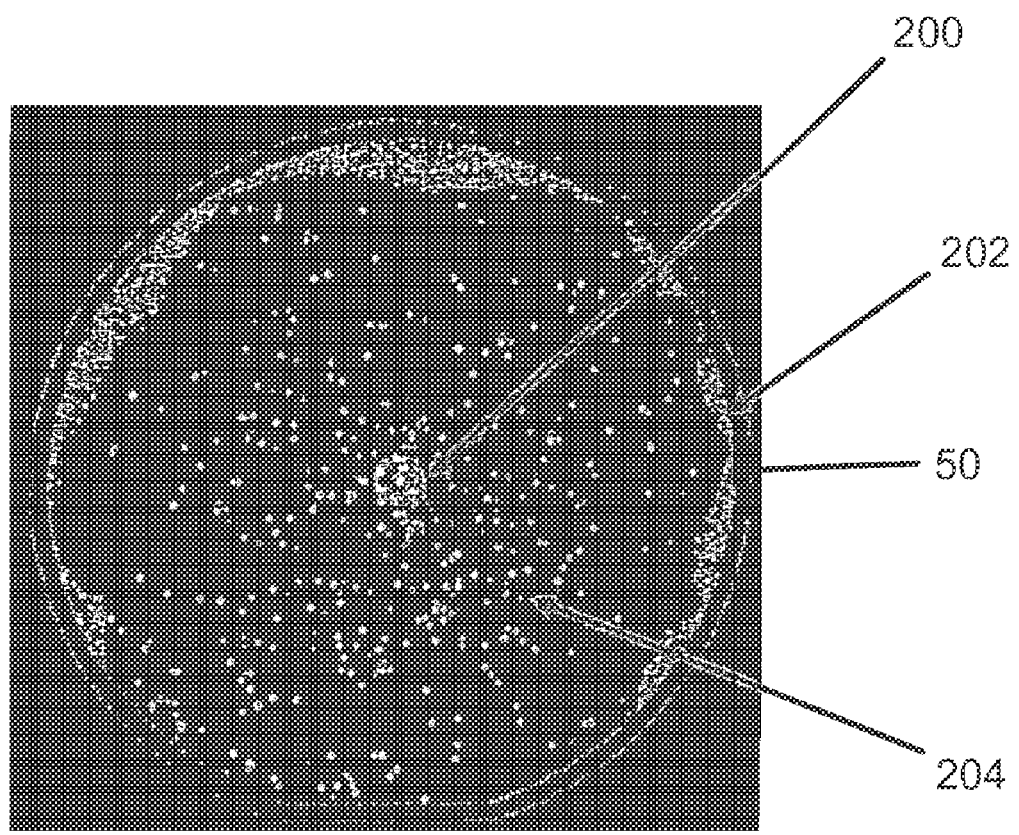
FIG. 4 shows a particle map of PE-SiON film left on a substrate as a result of the discovered evaporation zone of FIG. 3.

Referring to FIG. 3, the first problem region near the center of the substrate 50 is schematically illustrated as a dried area 9. At the beginning of existing Rotagoni drying methods, the dryer assembly 2 is initially positioned above the substrate 50 so that the N$_2$/IPA dispensing nozzle 5a is located directly above the rotational center region of the substrate 50. At this time, a layer of DIW is being applied to the surface of the substrate 50 via the DIW nozzle 4 of the dryer assembly 2. The N$_2$/IPA dispensing nozzle 5a is then opened and the dryer assembly 2 is moved toward the edge of the substrate 50 in the direction of the arrow while applying both the DIW and N$_2$/IPA vapor. It is believed that the N$_2$/IPA nozzle 5a is evaporating the liquid in the center region 9. The second problem area has been discovered to exist near the edge region of the substrate 50.

referring to FIG. 4, the problem with the above prior art method is visually illustrated. As can be seen, a circular area of localized particle contamination 200 about 1 cm in size has been discovered at or near the center region (i.e., the rotational center) of a substrate 50 using conventional drying. This contamination effect has been observed to be more pronounced on substrates having very sensitive films, like PE-SiON film. In such instances, hundreds to thousands of watermarks have been observed at the center region after performing the aforementioned Rotagoni drying method. The particle map of FIG. 4 also reveals the second problem region 202 as being located along the edge of substrate 50. Similar to the center region, it is believed that the defect/particle localization near the edge of the substrate 50 results from this region of the substrate being dried by evaporation rather than by the STG phenomena. It has also been observed that splash back watermarks 204 form on the substrate 50 at numerous spots on the surface.

As mentioned above, it is believed that the circular area of localized particle contamination 200 in the center region of the substrate 50 results from this area being dried by evaporation rather than STG phenomena. The cause of this evaporative drying is hypothesized to be two-fold. First, the N$_2$/IPA gas line initially contains a pressure spike. As a result of this pressure spike, when the valve that controls the N$_2$/IPA gas line is opened, the surface of the substrate under the N$_2$/IPA dispensing nozzle 5a is subjected to a sudden and unpredictable rush of N$_2$/IPA vapor having an increased gas flow rate. This unpredictable increase in the gas flow rate instantly evaporates the layer of DIW in this region on the substrate 50, thereby drying this area instantly through evaporation. This is schematically illustrated in FIG. 3 as center region 9.

Second, the initial position of the N$_2$/IPA dispensing nozzle 5a directly above the rotational center region of the substrate 50 also causes evaporation problems at the center region, independent of any N$_2$/IPA pressure spikes. As shown in FIG. 3, at the beginning of existing Rotagoni drying methods, the N$_2$/IPA dispensing nozzle 5a is located directly above the rotational center region of the substrate 50 and the DIW nozzle 4 is located off-center. Once the dryer assembly 2 is in this position, the DIW nozzle 4 is opened and a layer of DIW is applied to the entire surface of the rotating substrate 50. The N$_2$/IPA dispensing nozzles 5a and 5b are closed at this time. However, as soon as the N$_2$/IPA dispensing nozzle 5a is opened, the center region of the substrate 50 is instantly dried by evaporation, even when a pressure spike is not present in the N$_2$/IPA line. Evaporative drying of the center region is believed to result from the DIW nozzle 4 being unable to provide a sufficient amount of DIW to the center region of the rotating substrate 50. More specifically, the DIW nozzle 4 can not provide an adequate amount of DIW to the off-center location of the rotating substrate 50 to overcome the combined centrifugal force exerted on the DIW by the rotation of the substrate 50 and the blowing force of the N$_2$/IPA. As a result, the N$_2$/IPA quickly displaces and evaporates the DIW in center region 9, leaving any trapped particles on the center region of the substrate 50.

Referring to FIGS. 3 and 4 concurrently, concerning the second problem region 202 near the substrate 50 edge, the dryer assembly 2 is moved from near the center of the substrate 50 toward the edge of the substrate 50 with the DIW nozzle 4 leading the N$_2$/IPA dispensing nozzle 5a during a typical prior art Rotagoni drying process. As the dryer assembly 2 approaches the edge of the substrate 50, the 01W dispensing nozzle 4 is turned off while the dryer assembly 2 continues to move the N$_2$/IPA dispensing nozzle toward the edge of the substrate. The DIW is turned off to prevent DIW from being splashed back onto the substrate 50 from the unpredictable fluid dynamics resulting from the DIW being dispensed directly onto the edge of the substrate 50. However, it has been discovered that without DIW supplied (or with only DIW partially supplied) to the edge of the substrate 50, the demarcation between dried area and wet area often becomes ambiguous and, thus, the edge of the substrate 50 is no longer dried by the STG phenomena. As a result, the region close to the edge of the substrate 50 is supplied only or predominantly with N$_2$/IPA vapor, which causes the region to be dried through evaporation, leaving watermarks that result in particle contamination and defects.

Figure 1A:
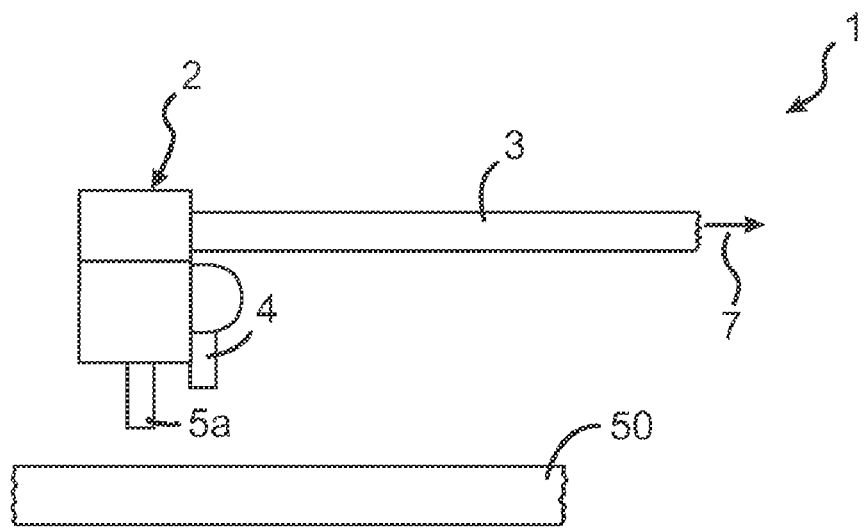
FIG. 1A is a front view of a prior art dryer assembly positioned above a substrate.
Figure 1B:
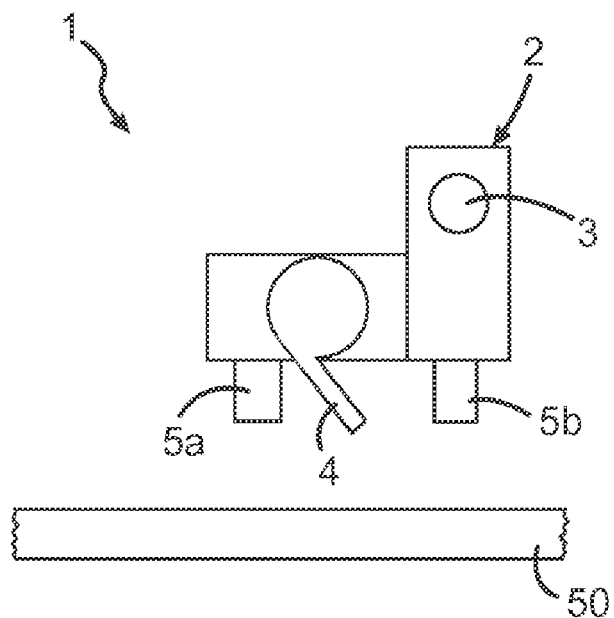
FIG. 1B is a right side view of the prior art dryer assembly of FIG. 1A.
Figure 2:
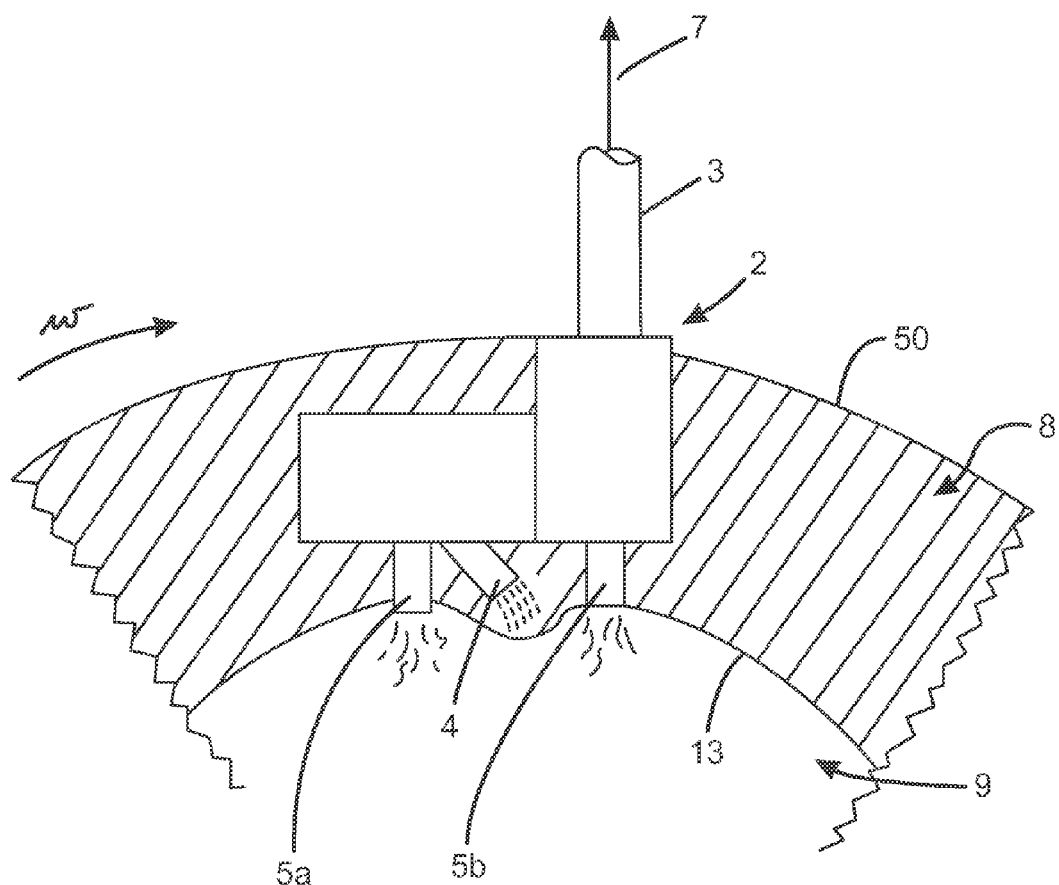
FIG. 2 is a schematic representation of the prior art drying assembly of FIG. 1A performing a prior art drying method.

With respect to the second problem region 202, attempts to remedy the evaporation problem near the edge of the substrate by increasing the amount N$_2$/IPA vapor supplied at or near the edge while continuing to supply DIW have resulted in discovering further deficiencies with the prior art Rotagoni drying system 1 of FIGS. 1A and 1B. It was initially believed that supplying more N$_2$/IPA vapor at or near the substrate 50 edge would substantially decrease the amount of watermarks left on the substrate 50. As the prior art drying system 1 had the option of activating the second ⅛" $N_2$/IPA dispensing nozzle 5b, it was thought that activating the second dispensing nozzle 5b would supply an adequate amount of $N_2$/IPA vapor to the edge of the substrate 50, thus, solving the watermark problem near the edge of the substrate 50. The structure of the prior art drying assembly 2, however, allowed only for the addition of the second $N_2$/IPA dispensing nozzle 5b to the side of and spaced from the first $N_2$/IPA dispensing nozzle 5a, such that the first and second $N_2$/IPA dispensing nozzles 5a, 5b and the DIW dispensing nozzle 4 form a general triangular pattern (as shown in FIGS. 1A and 1B).

It was observed that this configuration performed poorly when the two $N_2$/IPA dispensing nozzles 5a, 5b were run concurrently. For example, it was observed that one of the $N_2$/IPA dispensing nozzles 5a or 5b interrupted the drying pattern of the other $N_2$/IPA dispensing nozzle 5b or 5a at certain points. Most notably, the activation of the second $N_2$/IPA dispensing nozzle 5b blew water droplets into the drying circle of the first $N_2$/IPA dispensing nozzle 5a and vice-versa. While this interference was especially problematic during the beginning of the Rotagoni drying process, this problem persisted throughout the movement of the dryer assembly 2.

It has been discovered that the interference between the operation of the two $N_2$/IPA dispensing nozzles 5a, 5b is a result of their side-by-side positioning relative to the path of motion across the substrate 50. More specifically, referring to FIG. 3, the dryer assembly 2 is moved over the substrate 50 in a downward linear path in the negative Y-direction. However, because the two $N_2$/IPA dispensing nozzles 5a, 5b are spaced from one another solely in the X-direction, the paths of movement formed by each of the first and second $N_2$/IPA dispensing nozzles 5a, 5b are not aligned. As a result, the flow of the $N_2$/IPA vapor from the dispensing nozzle 5b interferes with the flow of the $N_2$/IPA vapor from the dispensing nozzle 5a for the entire path of movement, including along the edge of the substrate 50.

In a further attempt to remedy the evaporation problem near the edge of the substrate 50, the amount of $N_2$/IPA vapor supplied was increased, the first $N_2$/IPA dispensing nozzle 5a was increased from ⅛" to ¼" in diameter instead of activating the second $N_2$/IPA dispensing nozzle 5b. It was discovered, however, that increasing the diameter of the $N_2$/IPA dispensing nozzle 5a to ¼" had two problems. First, the initial gas flow pressure was so strong that water droplets were blown from the substrate center and over the splashguard. Second, the $N_2$/IPA vapor supply was still too weak when the assembly was placed close to the substrate edge.

In addition to the drawbacks discovered above, it has also been discovered that the STG drying phenomena can be interrupted if: (1) the $N_2$/IPA flow rate becomes too high; or (2) the $N_2$/IPA dispensing nozzle 5a or 5b and/or the DIW nozzle 4 position and angles are not correct. Although a higher flow rate adds more $N_2$/IPA vapor onto the substrate 50, it can cause blowing and evaporation of DIW on the substrate 50, an undesired effect for obvious reasons. If the $N_2$/IPA dispensing nozzle 5a or 5b or the DIW nozzle 4 loses its correct position and/or angle, evaporation and/or inadequate liquid removal can occur.

Figure 5:
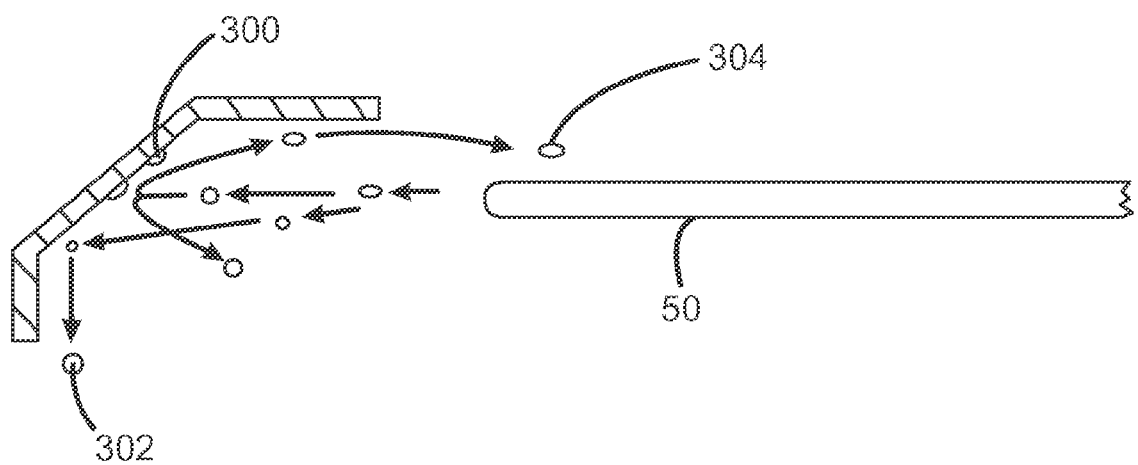
FIG. 5 is a schematic illustrating undesired splash back that was discovered to occur when using a prior art drying system and splash guard.

Referring now to FIG. 5, another problem known in the art is "splash back." Splash back is caused by fluid droplets deflecting back onto the substrate 50 during the drying process, which evaporate and cause watermarks on the surface of the substrate 50. Since the substrate spins during the drying process, kinetic energy is imparted to the DIW layer that is on the surface of the substrate 50. This energy is significant enough to cause fluid droplets to be thrown off the substrate and to hit the chamber wall or other surfaces and deflect back onto the substrate 50. Prior art drying methods only dry the front side of the substrate using the Rotagoni/STG liquid removal method. Typically, the STG drying process of the front side of the substrate is done under relatively low rpm, which requires a longer process time. The backside of the substrate, conversely, is dried by a high RPM spin process. In existing drying methods, the front side of substrate is first dried using a standard STG/Rotagoni drying process, after which the backside of the substrate is dried using a high RPM spin dry process. Current systems and methods do not consider and/or solve the problem of splash back.

Figure 6:
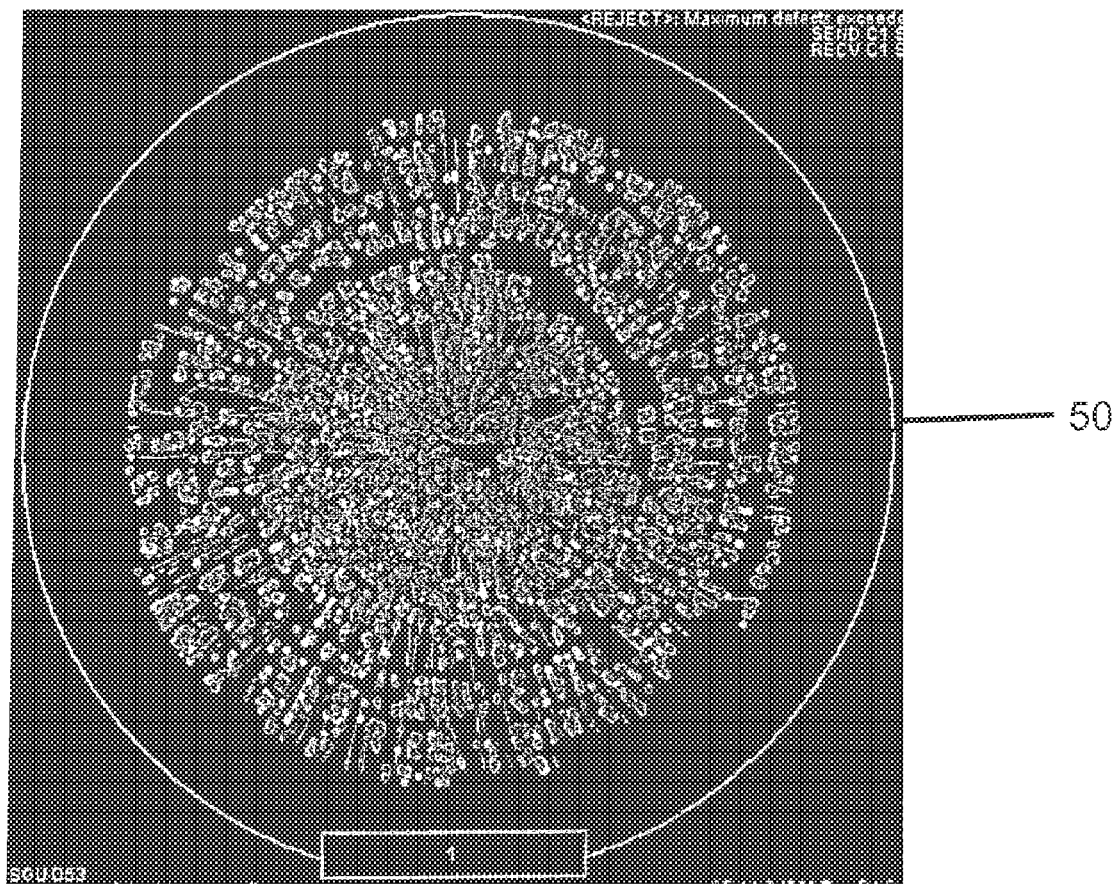
FIG. 6 shows a particle map of PE-SiON film left on a substrate when an insufficient amount of DIW was used during the performance of a prior art drying process.

It has been discovered, however, that the control of the supply of the DIW on the front side of substrate is of vital importance in protecting against the negative effects of splash back. First, during the backside high RPM spin dry, splash back landing on the front side of the substrate can cause massive amounts of defects if a sufficient amount of DIW is not applied to the front side of the substrate. Referring to FIG. 6, a defect map is shown for a substrate where an adequate amount of DIW was not supplied to the front surface during splash back. As can clearly be seen, if a substrate 50 surface is not covered with DIW, thousands of watermarks can be generated on the surface.

Second, during the Rotagoni drying process on the front side of the substrate 50, it has been discovered that the outer part of the wafer should be covered with DIW until the assembly dries this portion. Moreover, the wafer should be isolated from the air to prevent the reaction between substrate, water, and oxygen in the air. Hydrophilic wafers can be covered easily even with small amounts of DIW but hydrophobic surface requires much more DIW.

Additionally, and referring back to FIG. 5, it has been discovered that while some fluid droplets (e.g., first droplet 302) hit and deflect off existing splash guards; other fluid droplets (e.g., second droplet 300) hit and adhere to the splash guard due to intermolecular or other forces. Experiments have shown that if subsequent fluid droplets impact the fluid droplets 300 that remain on the splash guard, the impact/crash of a new fluid droplet against this adhered fluid droplet 300 creates a spray of smaller fluid droplets which scatter in multiple directions. Naturally, some of these smaller fluid droplets (e.g., third droplet 304) land on the substrate 50 that has been previously dried through the STG phenomena and evaporate, forming watermarks.

Yet another drawback with the prior art Rotagoni/STG drying methods is the unpredictable concentration of IPA in the $N_2$/IPA vapor. Initially, the $N_2$/IPA mixture is prepared in an IPA canister. A tube supplying $N_2$ is placed into the liquid IPA and $N_2$ bubbles out from a specially designed tip of the $N_2$ tube placed within the liquid. Existing IPA canisters, however, are thick and short. Thus, existing IPA canisters provide for only a short $N_2$ bubble path from the specially designed tip to the main $N_2$/IPA supply line. This allows for only a small time for exposure between the $N_2$ and IPA. Thus, the $N_2$ bubbles are not exposed to IPA for a sufficiently long enough time to reach a saturation point of IPA in the $N_2$ gas. Thus, the concentration of IPA in the $N_2$/IPA gas fluctuate and is unpredictable when used with conventional IPA canisters.

In view of the discovery of the aforementioned deficiencies in prior art drying systems and methods, and in further view of the discovery of the source of these deficiencies, a novel drying system and drying method have been invented that eliminate and/or minimize at least one or more of these deficiencies. An embodiment of the inventive drying system and method that solves one or more of the aforementioned deficiencies will be described with reference to FIGS. 7-21. The figures and following description describes embodiments of the present invention for purposes of illustration only. Those skilled in the art will readily recognize from the following discussion that alternative embodiments of the structures and methods illustrated herein may be employed without departing from the principles of the invention.

Figure 7:
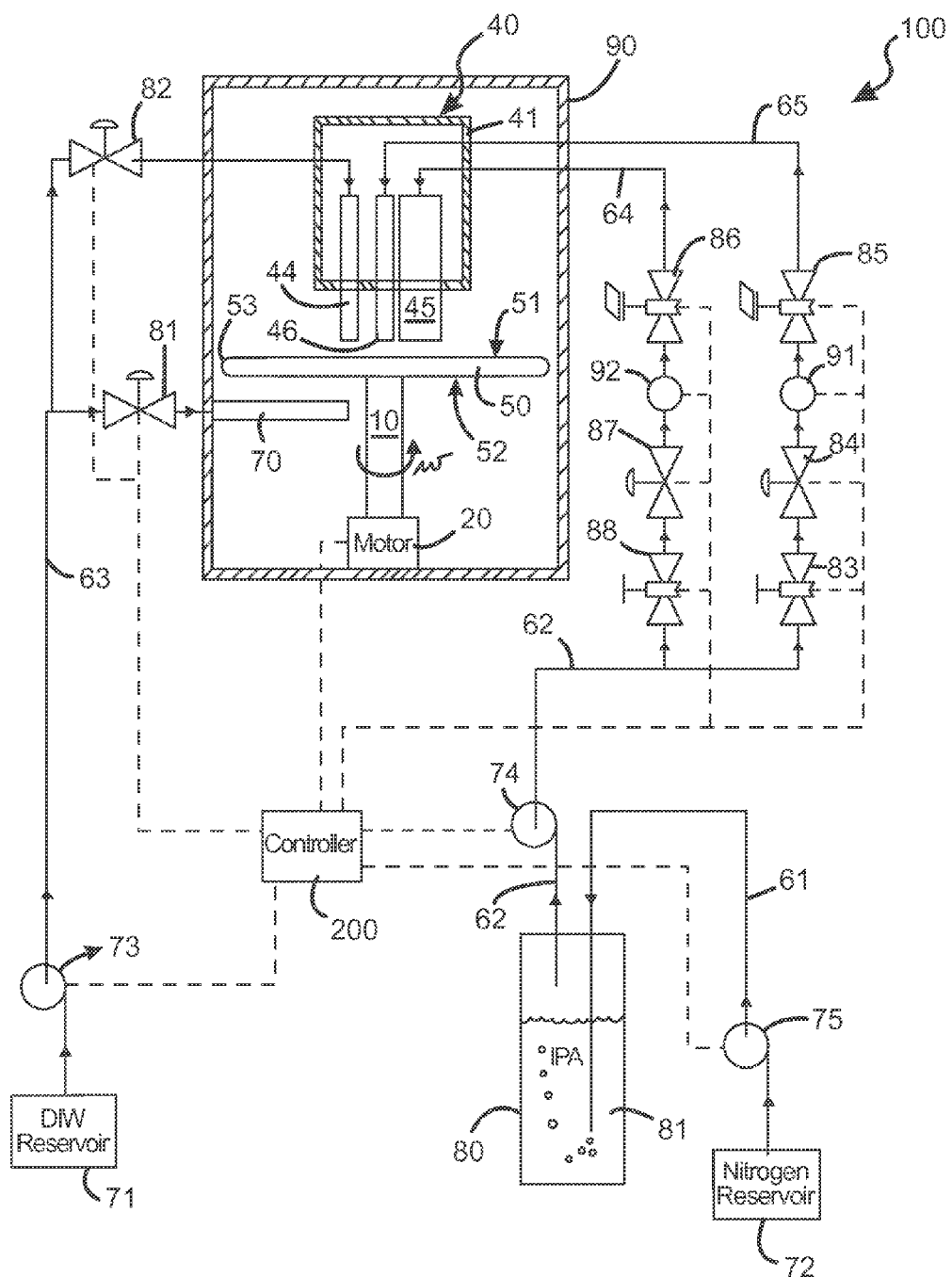
FIG. 7 is a schematic of a drying system according to an embodiment of the present invention.

Referring first to FIG. 7, a schematic of an improved drying system 100 for drying a rotating substrate 50 is illustrated according to an embodiment of the present invention. The drying system 100 comprises a process chamber 90, a dryer assembly 40, a rotary support 10, a DIW reservoir 71, a bubbler 80 holding IPA 81, and a nitrogen reservoir 72. While not illustrated, in some embodiments the drying system 100 will comprise a novel splash back guard that surrounds the periphery of the substrate 50. The details of such a splash guard will be described in detail below with reference to FIGS. 12 and 13. Furthermore, while the components and arrangement of the drying system are illustrated in specific structural embodiments, the invention is not limited to those specific structures, shapes, components unless clearly required in the claims. For example, the process chamber 90 can take on any shape, size or configuration.

Referring still to FIG. 7, the rotary support 10 is positioned within the process chamber 90 and is adapted to support a substrate 50 in a substantially horizontal orientation. Preferably, the rotary support 10 contacts and engages only the perimeter of the substrate 50 in performing its support function. However, other support structures can be used, such as chucks, plates, etc. The rotary support 10 is operably coupled to a motor 20 to facilitate rotation of the substrate 50 within the horizontal plane of support. The motor 20 is preferably a variable speed motor that can rotate the support 10 at any desired rotational speed ω. The motor 20 is electrically and operably coupled to the controller 200. The controller 200 controls the operation of the motor 20, ensuring that the desired rotational speed ω and desired duration of rotation are achieved.

The drying system 90 further comprises a backside nozzle 70 operably and fluidly coupled to the DIW reservoir 71. The backside DIW dispensing nozzle 70 is fluidly connected to a main DIW supply line 63, which is operably connected to a pump 73 and DIW supply 71. A pneumatic valve 81 is operably connected to the main DIW supply line 63 so as to be capable of controlling the supply of DIW to the backside DIW dispensing nozzle 70. The type of valve that is used to control the supply of the DIW to the backside nozzle 70, however, is not so limited and other types of valves can be used, including without limitation, a proportional valve, manual valve, pneumatic valve or any combination thereof can be used. The backside nozzle 70 is positioned and oriented within the process chamber 90 so that when DIW is flowed therethrough, the DIW is applied to the bottom surface 52 of the substrate 50. When the substrate 50 is rotating, the DIW applied by the nozzle 70 forms a layer or film of DIW across the entirety of the bottom surface 52 of the substrate 50.

The dryer assembly 40 is mounted within the process chamber 90 so as to be positioned closely to and above a top surface 51 of a substrate 50 that is positioned on the support 10. The dryer assembly 40 comprises a housing 41 that holds a DIW dispensing nozzle 44, a first N$_2$/IPA dispensing nozzle 45, and a second N$_2$/IPA dispensing nozzle 46. As will be discussed in greater detail below, the DIW dispensing nozzle 44 and the N$_2$/IPA dispensing nozzles 45, 46 are operably and fluidly coupled to the DIW reservoir 71 and the bubbler 80 (or other source of N$_2$/IPA vapor) respectively. The housing 41 is preferably mounted above the substrate 50 by a support arm 42 (shown in FIG. 9) in a cantilevered fashion. However, the housing 41 can be mounted above the substrate 50 in a variety of ways, none of which are limiting of the present invention. Additionally, the dryer assembly 40 can take on a wide variety of structural arrangements. For example, in some embodiments, a housing 41 may not be used. Instead, a frame or skeletal structure can be used.

The housing 41 can be translated/moved above the substrate 50 in a generally horizontal direction so that the DIW dispensing nozzle 44 and the N$_2$/IPA dispensing nozzles 45, 46 can be moved from at least a position above the center of the substrate 50 to a position beyond the edge 53 of the substrate 50. The movement of the housing 41 relative to the substrate 50 can be effectuated by coupling the entire dryer assembly 40 to a linear drive assembly (not illustrated) having a motor. An example of such a drive assembly is disclosed in United States Patent Application Publication 2004/0020512, published Feb. 5, 2004, the teachings of which are hereby incorporated by reference. Of course, it is apparent to those skilled in the art, that a multitude of assemblies can be used to effectuate the desired movement of the housing 41 (or entire dryer assembly 40) above the substrate 50. In some embodiments of the invention, the relative motion between the housing 41 and the substrate 50 can be achieved by translating the substrate 50 itself while holding the housing 41 stationary.

The DIW dispensing nozzle 44 is operably and fluidly connected to the main DIW supply line 63, which in turn is fluidly coupled to the DIW reservoir 71 As mentioned above, a pump 73 is operably coupled to the main DIW supply line 63. When activated by the controller 200, the pump 73 will draw DIW from the DIW reservoir 71 and flow the DIW through the main DIW supply line 63. A pneumatic valve 82 (which is also controlled by the control 200) is operably connected to the main DIW supply line 63 so as to be capable of controlling the supply of the DIW to the DIW dispensing nozzle 44 as desired. The type of valve that is used to control the supply of the DIW to the DIW dispensing nozzle 44, however, is not so limited and many other types of valves can be used, including without limitation, a proportional valve, manual valve, pneumatic valve or any combination thereof.

The N$_2$/IPA dispensing nozzles 45, 46 are operably and fluidly coupled to a source of N$_2$/IPA vapor, which in the illustrated embodiment is the bubbler 80. The first N$_2$/IPA dispensing nozzles 45 is operably and fluidly coupled to the first N$_2$/IPA supply line 64 while the second N$_2$/IPA dispensing nozzles 46 is operably and fluidly coupled to the second N$_2$/IPA supply line 65. Both the first and second N$_2$/IPA supply lines 64, 65 are operably and fluidly coupled to a main N$_2$/IPA supply line 62. The main N$_2$/IPA supply line 62 is in turn operably and fluidly connected the bubbler 80. An N$_2$/IPA pump 74 is operably connected to the bubbler 80 so as to be capable of drawing N$_2$/IPA vapor from the bubbler 80 and flowing the N$_2$/IPA vapor through the main N$_2$/IPA supply line 62 and into the first and second N$_2$/IPA supply lines 64, 65, for delivery to the first and second N$_2$/IPA dispensing nozzles 45, 46. The formation of the N$_2$/IPA vapor in the bubbler 80 will be described in further detail below.

A first manual valve 88, a first pneumatic valve 87, a first flow meter 92, and a first proportional valve 86 are operably coupled to the first N$_2$/IPA supply line 64 to monitor and control the flow of N$_2$/IPA vapor to the first N$_2$/IPA dispensing nozzle 45. Similarly, a second manual valve 83, a second pneumatic valve 84, a second flow meter 91, and a second proportional valve 85 are operably coupled to the second N$_2$/IPA supply line 65 to monitor and control the flow of N$_2$/IPA vapor to the second N$_2$/IPA dispensing nozzle 46. All valves are electrically and operably coupled to the controller 200 for automated communication and control.

Both the first proportional valve 86 and the second proportional valve 85 are capable of being incrementally adjusted from a closed position to an open position in a gradual manner. The first proportional valve 86 and the second proportional valve 85 can be adjusted incrementally independent from each other or in conjunction with one another. The graduated/incremental opening of the proportional valves 85, 86 eliminates and/or moderates the pressure spike that has been discovered to be common in $N_2$/IPA vapor supply lines. As a result, utilizing the proportional valves 85, 86 eliminates/controls the inrush of $N_2$/IPA vapor that causes evaporative drying during the start-up sequence, as previously described.

For example, when either proportional valve 85, 86 receives an open signal from the controller 200, the targeted proportional valve opens incrementally in a graduated manner until it reaches a predetermined set point. In one embodiment, an electromagnetic force can be used to gradually open the proportional valves 85, 86. The proportional valves, however, are not so limited and can be gradually opened using other methods known in the art. Finally, while the first and second $N_2$/IPA supply lines 64, 65 are also operably coupled to the manual valves 88, 83, the pneumatic valves 87, 84, and the flow meters 92, 91, or any combination thereof, such coupling may not be necessary for the present invention.

The system controller 200 can be a suitable microprocessor based programmable logic controller, personal computer, or the like for process control. The system controller 200 preferably includes various input/output ports used to provide connections to the various components of the drying system 100 that need to be controlled and/or communicated with. The electrical connections are indicated in dotted line in FIG. 7. The system controller 200 also preferably comprises sufficient memory to store process recipes and other data, such as thresholds inputted by an operator, processing times, rotational speeds, processing conditions, processing temperatures, flow rates, desired concentrations, sequence operations, and the like. The system controller 200 can communicate with the various components of the drying system 100 to automatically adjust process conditions, such as flow rates, rotational speed, movement of the drying assembly 40, etc. as necessary. The type of system controller used for any given system will depend on the exact needs of the system in which it is incorporated.

It should be noted that the inventive drying method described below with respect to FIGS. 14-21 can be entirely automated by properly programming the controller 200 to carry out the necessary steps. The operation of the drying system 100, which includes movement of the dryer assembly 40, rotation of the support 10, and the flowing of process fluids though the nozzles 70, 44-46 can be controlled through a controller 200 in order to sufficiently dry the substrate 50. More specifically, in one embodiment, the controller 200 can communicate with and control the servomotor 20 that moves the dryer assembly 40, the pneumatic valves 81,82,84,87, the proportional valves 85,86, the flow meters 91,92, the manual valves 83,88, and the pumps 73-75. Desired process parameters and recipes can be stored in the memory to implement various control strategies to maximize performance of the drying system 100. Different control strategies may be selected depending upon many factors, for example, the size of the substrate, the cleaning solution used, the sensitivity of the structures being constructed on the surface of the substrate, and the degree of cleanliness required, among others.

Figure 8A:
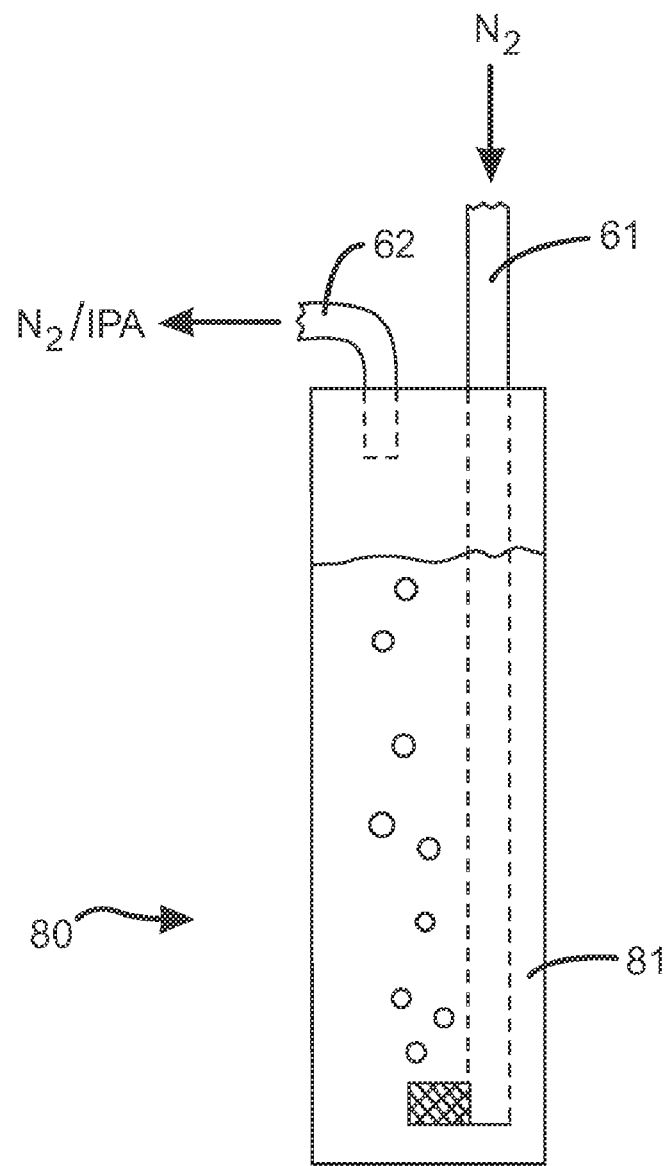
FIG. 8a is a schematic of an inventive IPA bubbler that can be used in the drying system of FIG. 7 according to an embodiment of the present invention.

With reference to FIGS. 7 and 8a, the formation of the $N_2$/IPA vapor in the bubbler 80 will now be described. First, $N_2$ gas is introduced into the canister of the bubbler 80 through an $N_2$ supply tube 61. A pump 75 is operably coupled to the $N_2$ supply tube 61 to draw the $N_2$ gas from the nitrogen reservoir 72 and flow it though the $N_2$ supply tube 61. Alternatively, the nitrogen reservoir 72 can be pressurized and a valve can be coupled to the $N_2$ supply tube 61 to control the flow therethrough. An open end of the $N_2$ supply tube 61 is positioned in the canister of the bubbler 80 and submerged in the liquid IPA 81 within the canister. The open end of the $N_2$ supply tube 61, where the $N_2$ gas exits, is located approximately at the bottom of the canister. As the $N_2$ gas exits the $N_2$ supply tube 61, the $N_2$ gas naturally forms bubbles, which rise through the liquid IPA 80, thereby forming $N_2$/IPA vapor in the open space in the canister above the liquid IPA 81. The $N_2$/IPA vapor is then drawn therefrom through the main $N_2$/IPA supply line 62 as needed.

In order to have a stable concentration of IPA in the $N_2$/IPA vapor, it has been discovered that the $N_2$ bubble size should be small and the depth of the canister should be substantial, promoting a longer exposure time between the $N_2$ gas and the liquid IPA 81. This allows for the IPA to reach its saturation concentration in the $N_2$ gas before the $N_2$ gas escapes from the IPA liquid. Existing canister designs cannot accomplish this because they are too short and the $N_2$ gas bubbles escape from the IPA liquid 81 too quickly. The bubbler 80 of the present invention, however, comprises a taller thinner canister so that the $N_2$ gas can reach full saturation before exiting the IPA liquid 81.

Being able to regulate the temperature at which the $N_2$/IPA vapor is dispensed onto the substrate 50 and/or being able to maintain the $N_2$/IPA vapor at a constant temperature is desirable. Condensation can occur on the substrate 50 surface when there is a difference in temperature between the $N_2$/IPA vapor applied to the substrate 50 and the substrate 50 surface. Condensation can be reduced or eliminated if the temperature at which the $N_2$/IPA vapor is applied to the front side of the substrate 50 is substantially the same as the temperature of the substrate 50 surface. Generally, it is desirable to apply the $N_2$/IPA vapor at a temperature within 5 degrees of the temperature of the substrate 50. Preferably, the temperature at which the $N_2$/IPA vapor is applied is between 45 degrees Celsius and ambient temperature. Condensation can also be reduced if heated DIW is applied to the back side of the substrate 50 before or during application of heated $N_2$/IPA vapor on the front side of the substrate 50.

Figure 8B:
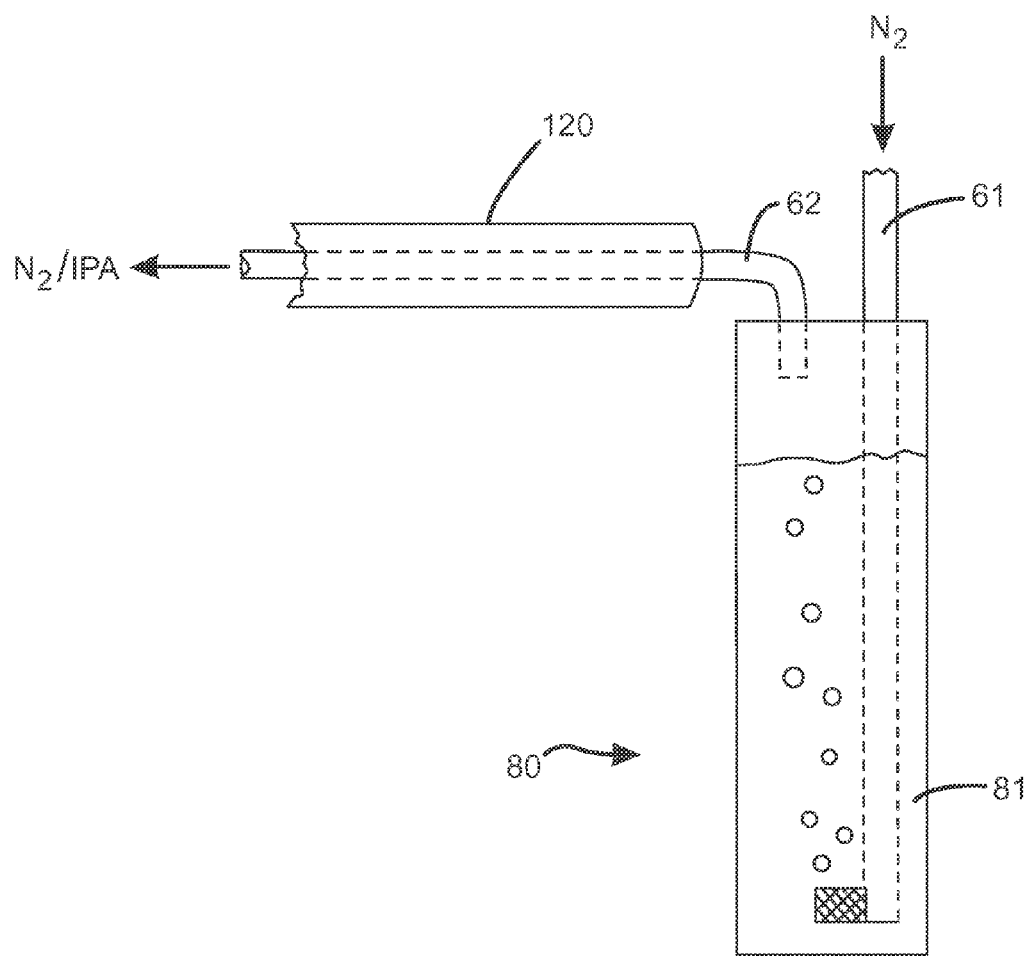
FIG. 8b is a schematic of an inventive IPA bubbler system with an insulated delivery line that can be used in the drying system of FIG. 7 according to an embodiment of the present invention.

Referring to FIG. 8b, in one embodiment of the present invention the $N_2$/IPA supply line 62 is insulated with a layer of insulation 120 along its entire length or for at least a portion of its entire length. The insulation 120 can be comprised of any suitable insulative material including but not limited to plastic, rubber, foam, cellulose, fiberglass or any combination thereof. When $N_2$/IPA vapor is delivered through the $N_2$/IPA supply line 62, the insulation 120 maintains the temperature of the $N_2$/IPA vapor within the desired temperature range. In one embodiment, the $N_2$/IPA vapor may be heated prior to entering the $N_2$/IPA supply line 62.

Figure 8C:
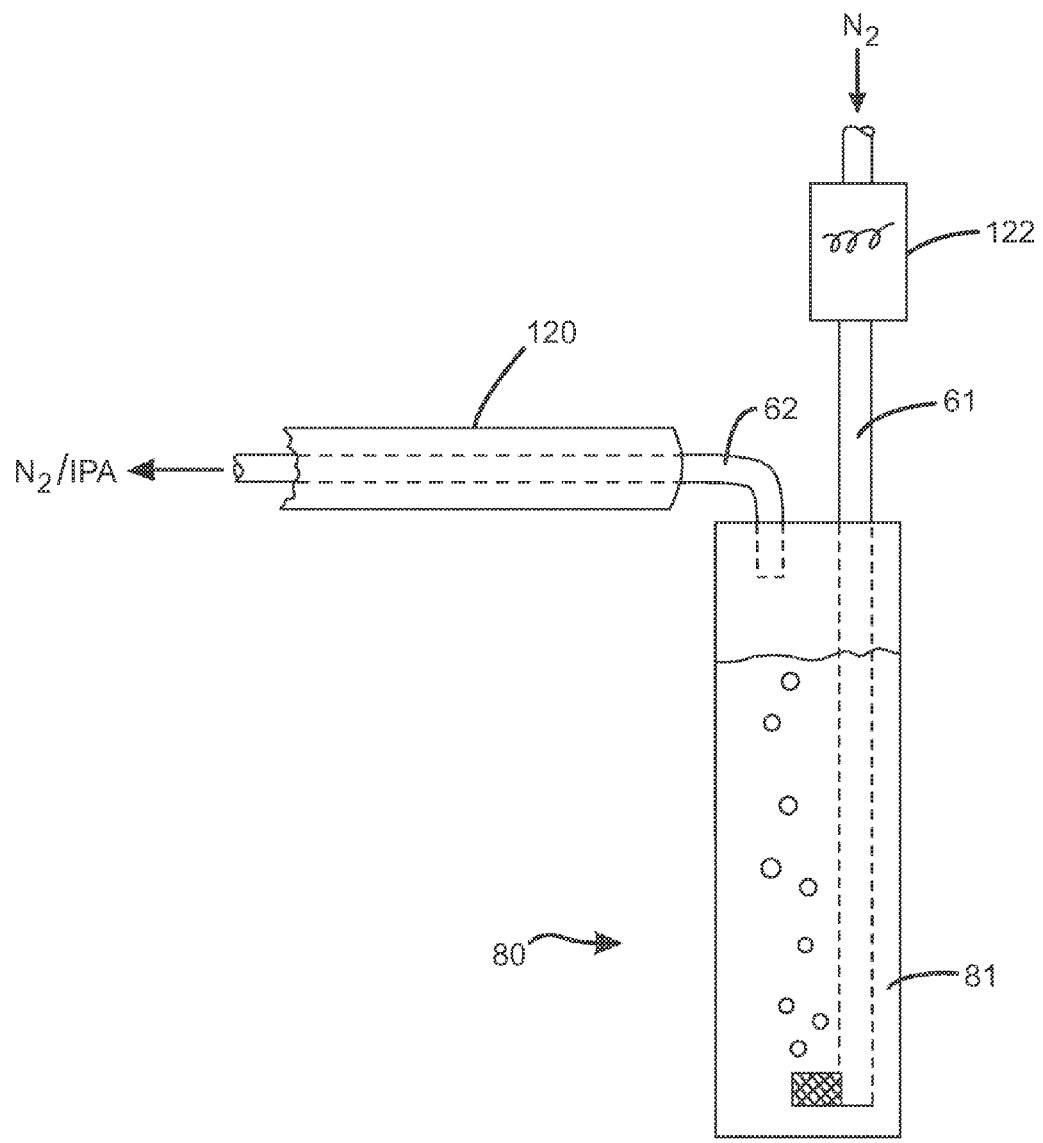
FIG. 8c is a schematic of an inventive IPA bubbler system utilizing heated $N_2$ and the insulated delivery line of FIG. 8c that can be used in the drying system according to an embodiment of the present invention.

Referring to FIG. 8c, an $N_2$ heating unit 122 may be operably connected to the $N_2$ supply tube 61 in order to heat the $N_2$ to a desired temperature prior to being exposed to the IPA liquid. The $N_2$ heating unit 122 can be any suitable device that transfers heat to the $N_2$ within the $N_2$ supply tube 61 such as parallel-flow or counter-flow heat exchangers. The heated $N_2$ gas is introduced into the canister of the bubbler 80 through the $N_2$ supply tube 61. As stated previously, an open end of the $N_2$ supply tube 61 is positioned in the canister of the bubbler 80 and submerged in the liquid IPA 81 within the canister. The heated $N_2$ gas exits the $N_2$ supply tube 61, naturally forming bubbles, which rise through the liquid IPA 80. Due to the heated nature of N$_2$/IPA vapor, the N$_2$ gas bubbles may be able to absorb a greater amount of IPA, thereby increasing the concentration of IPA in the resulting N$_2$/IPA vapor.

Figure 8D:
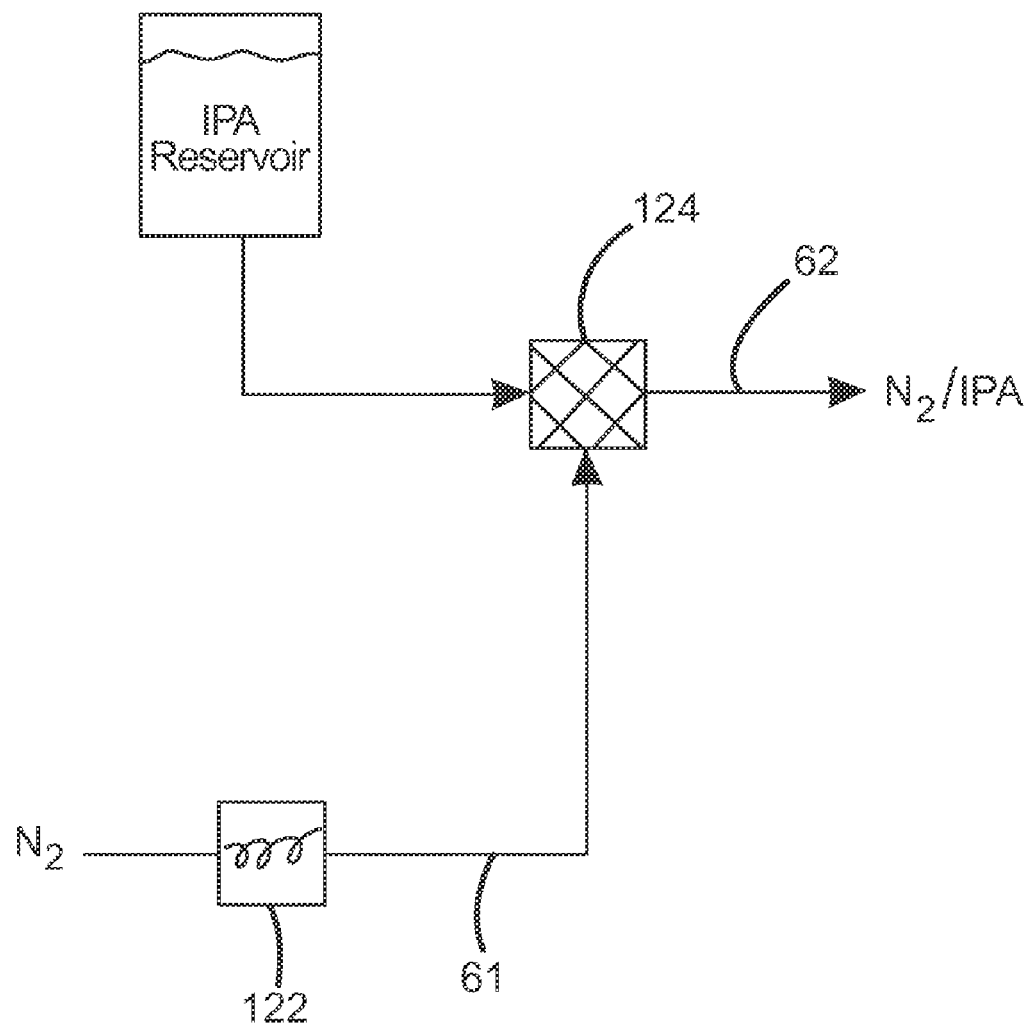
FIG. 8d is a schematic of an alternative drying vapor generating subsystem having a porous media to mix IPA with heated $N_2$ that can be used in conjunction with the drying system of FIG. 7 according to an embodiment of the present invention.

Referring now to FIG. 8d, an alternative embodiment subsystem for creating N$_2$/IPA vapor is illustrated. In this subsystem, a heated N$_2$ gas is delivered through the N$_2$ supply tube 61 into a porous media 124 where it mixes with IPA to form heated N$_2$/IPA vapor. The porous media 124 can be a tube, membrane or other structure. Preferably, the mixing of the IPA with the heated N$_2$ gas is at or substantially at the point-of-use. The IPA is injected into the porous media from a separate IPA supply line connected to an IPA source. The heated N$_2$/IPA vapor exits the porous media 124 into the main N$_2$/IPA supply line 62. The temperature of the heated N$_2$/IPA vapor is maintained at an acceptable temperature range through use of the insulation 120 surrounding or otherwise operably connected to the main N$_2$/IPA supply line 62.

In another alternate embodiment that is not illustrated, the IPA canister can be soaked in a hot DI water tub to control temperature. Using this processes, N$_2$/IPA vapor is formed in the IPA canister and exits through an N$_2$/IPA line. Heated N$_2$ is then flowed through another heated N$_2$ supply line to converge with and encapsulate the N$_2$/IPA supply line at a convergence point, forming a double-contained line. In other words, as the heated N$_2$ supply line and N$_2$/IPA line converge, a portion of N$_2$/IPA line becomes contained within the heated N$_2$ supply line such that heated N$_2$ fluid flows around and along the outer surface area of the N$_2$/IPA line. The flow of the heated N$_2$ fluid is a direction generally parallel to the flow of N$_2$/IPA vapor in the N$_2$/IPA line. Preferably, the N$_2$/IPA line tubing is corrugated when it is double-contained within the heated N$_2$ supply line tubing. This has the effect of promoting heat transfer from the hotter N$_2$ gas (flowing through the inner N$_2$ supply line) to the cooler N$_2$/IPA vapor (flowing through the N$_2$/IPA line). The double-contained line can optionally be insulated with insulation.

At a farther point along the double-contained line, the double-contained line diverges back into two lines: (1) a heated N$_2$ gas line and (2) an N$_2$/IPA vapor line. The post-divergence heated N$_2$ supply line returns to the N$_2$ source, is heated and later returns back to the convergence point, or alternatively exits through an exhaust. The post-divergence N$_2$/IPA line flows to the dryer assembly 40.

Figure 9:
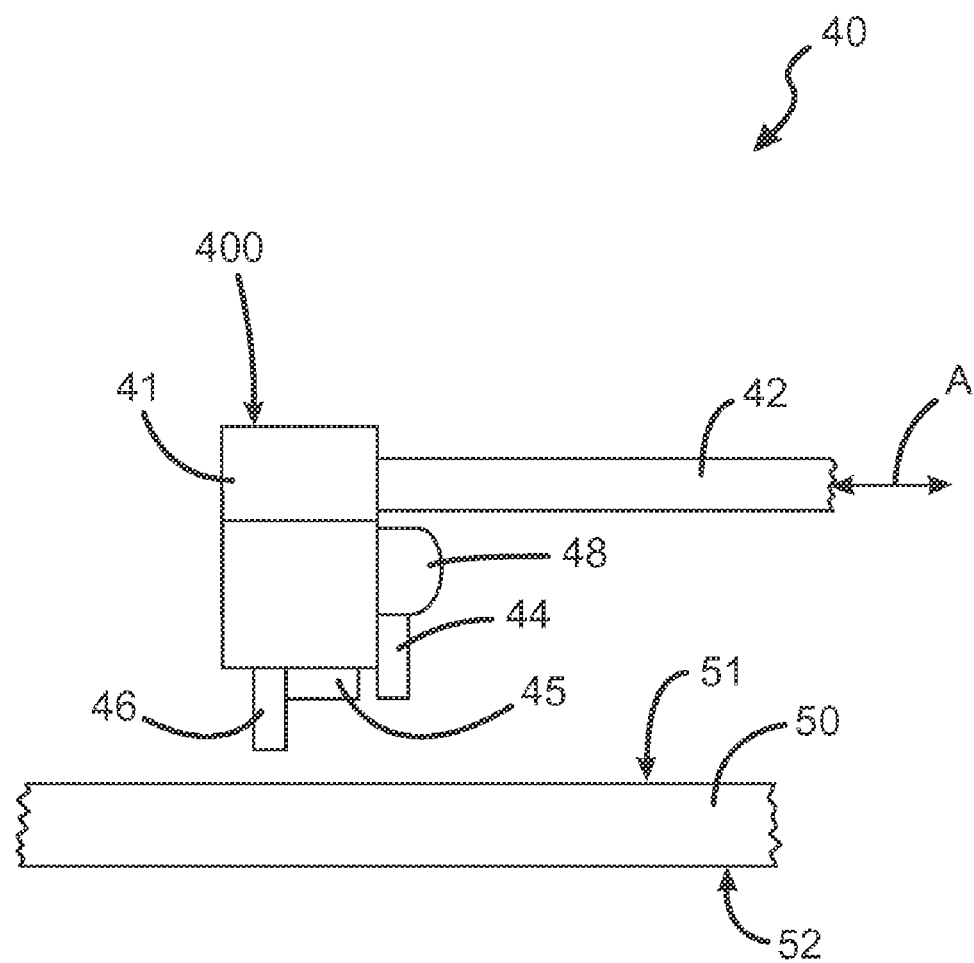
FIG. 9 is a front view of a dryer assembly according to an embodiment of the present invention that can be used in the drying system of FIG. 7.
Figure 10:
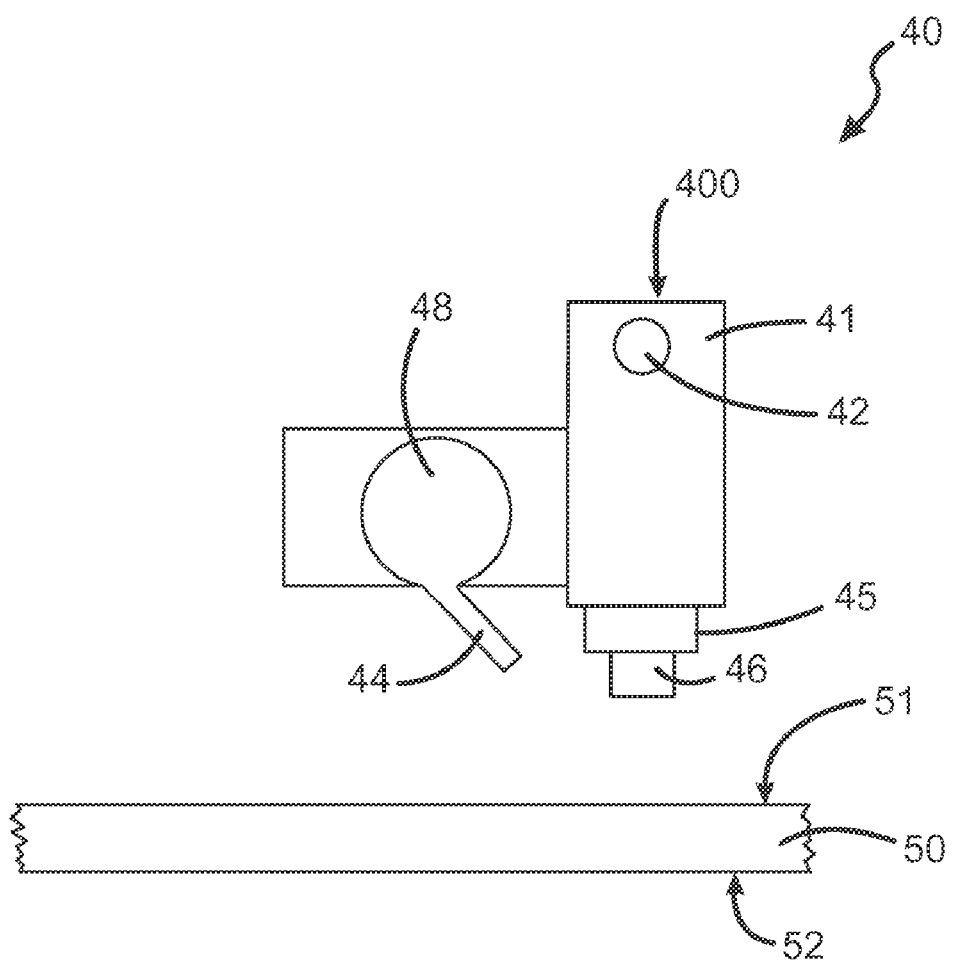
FIG. 10 is a right view of the dryer assembly of FIG. 10.

Referring now to FIGS. 9 and 10, a novel dryer assembly 40 is illustrated in detail according to a preferred embodiment of the present invention. The dryer assembly 40 comprises a head portion 400 attached to a distal end of a support arm 42. When incorporated into a drying system/chamber such as system 100 of FIG. 7, the support arm 42 supports the head portion 400 in a close spaced relation to the top surface 51 of the substrate 50. The head portion 400 can be moved back and forth in the direction indicated by arrow A generally parallel to the top surface 51 of the substrate 50. More specifically, the head portion 400 can preferably be moved along arrow A between process positions above the substrate 50 and a retracted position where the head portion 400 is withdrawn beyond the edge of the substrate 50 so as to not interfere with removal of the substrate 50 from its support 10.

The movement of the head portion 400 with respect to the substrate 50 is achieved by moving the entire dryer assembly 40, including the support arm 42. In other words, the support arm 42 is mounted to be moveable radially with respect to the substrate 50 into and out of a position closely spaced above the top surface 51 of the substrate 50. Preferably, the top surface 51 is the device side of the substrate 50. However, in other embodiments, the necessary relative motion may be facilitated by moving only the head portion 400 or the substrate 50 itself.

The housing 41 is a two-part housing. Preferably the housing 41 is made of a non-contaminating material, such as for example polypropylene or flouropolymers. The housing 41 supports and houses the DIW dispensing nozzle 44, the first N$_2$/IPA dispensing nozzle 45, and the second N$_2$/IPA dispensing nozzle 46. The DIW dispensing nozzle 44 is supported by a knob 48 that is pivotably connected to the housing 41. As such, the angle at which the DIW dispensing nozzle 44 is oriented with respect to the top surface 51 of the substrate 50 can be varied as desired. As illustrated, the DIW dispensing nozzle 44 is oriented at approximately a 45° angle with respect the top planar surface 51 of the substrate 50. The plumbing necessary to supply the DIW to the DIW dispensing nozzle 44 can be located within the support arm 42 or can be coupled thereto. While the DIW dispensing nozzle 44 can be any variety of shapes and sizes, in the preferred embodiment the DIW dispensing nozzle 44 is circular in shape with a ⅛" diameter.

The first and second N$_2$/IPA dispensing nozzles 45, 46 are oriented partially within or as part of the housing 41 so that their dispensing positions are substantially perpendicular to the top planar surface 51 of the substrate 50. As a result, the N$_2$/IPA vapor is applied to the top planar surface 51 of the substrate 50 in a substantially perpendicular manner. The plumbing necessary to supply the N$_2$/IPA vapor to the N$_2$/IPA dispensing nozzles 45, 46 can be located within the support arm 42 or can be coupled thereto.

The opening of the first N$_2$/IPA dispensing nozzle 45 is larger than the opening of the second N$_2$/IPA dispensing nozzle 46, preferably having an opening area about twice as large. While the nozzle openings are preferably circular, the nozzle openings are not so limited and can be any variety of shapes including but not limited to square, rectangular or oval in shape. In one preferred embodiment, both N$_2$/IPA dispensing nozzles 45, 46 are circular wherein the first N$_2$/IPA dispensing nozzle 45 has a ¼" diameter opening and the second N$_2$/IPA dispensing nozzle 46 has a ⅛" diameter opening. The second N$_2$/IPA dispensing nozzle 46 extends a greater distance from the housing 41 than does the first N$_2$/IPA dispensing nozzle 45. As such, the end/opening of the second N$_2$/IPA dispensing nozzle 46 from which N$_2$/IPA vapor is dispensed is located closer to the surface 53 of the substrate 50 than is the end/opening of the second N$_2$/IPA dispensing nozzle 45.

The first N$_2$/IPA dispensing nozzle 45 is positioned in contact with and adjacent to the second N$_2$/IPA dispensing nozzle 46. The first and second N$_2$/IPA dispensing nozzles 45, 46 are spaced from the DIW nozzle 44 by a distance. Importantly, the first and second N$_2$/IPA dispensing nozzles 45, 46 are positioned on the housing 41 so as to be aligned along an axis that is substantially parallel to the path of movement (indicated by arrow A) of the head portion 400. As a result, when the header portion 400 is moved along its path of movement above the substrate 50 during a Rotagoni drying cycle, the N$_2$/IPA vapor streams dispensed by the first and second N$_2$/IPA dispensing nozzles 45, 46 do not interfere with one another as discussed above with the prior art systems. Instead, aligning the first and second N$_2$/IPA dispensing nozzles 45, 46 along an axis that is substantially parallel to the path of movement allows the N$_2$/IPA vapor streams to compliment one another. This complementing effect is further enhanced by the close positioning of the first and second N$_2$/IPA dispensing nozzles 45, 46 to one another. More specifically, the second N$_2$/IPA dispensing nozzle 46 directly trails the first N$_2$/IPA dispensing nozzle 45 in the same path of movement.

Finally, the relative positioning of the first and second N$_2$/IPA dispensing nozzles 45, 46 and the angle of orientation of the DIW dispensing nozzle 44 results in the N$_2$/IPA vapor and the DIW being dispensed on the substrate 50 along the same linear path (with the substrate-to-DIW interface leading the N$_2$/IPA vapor-to-substrate interface).

Figure 11:
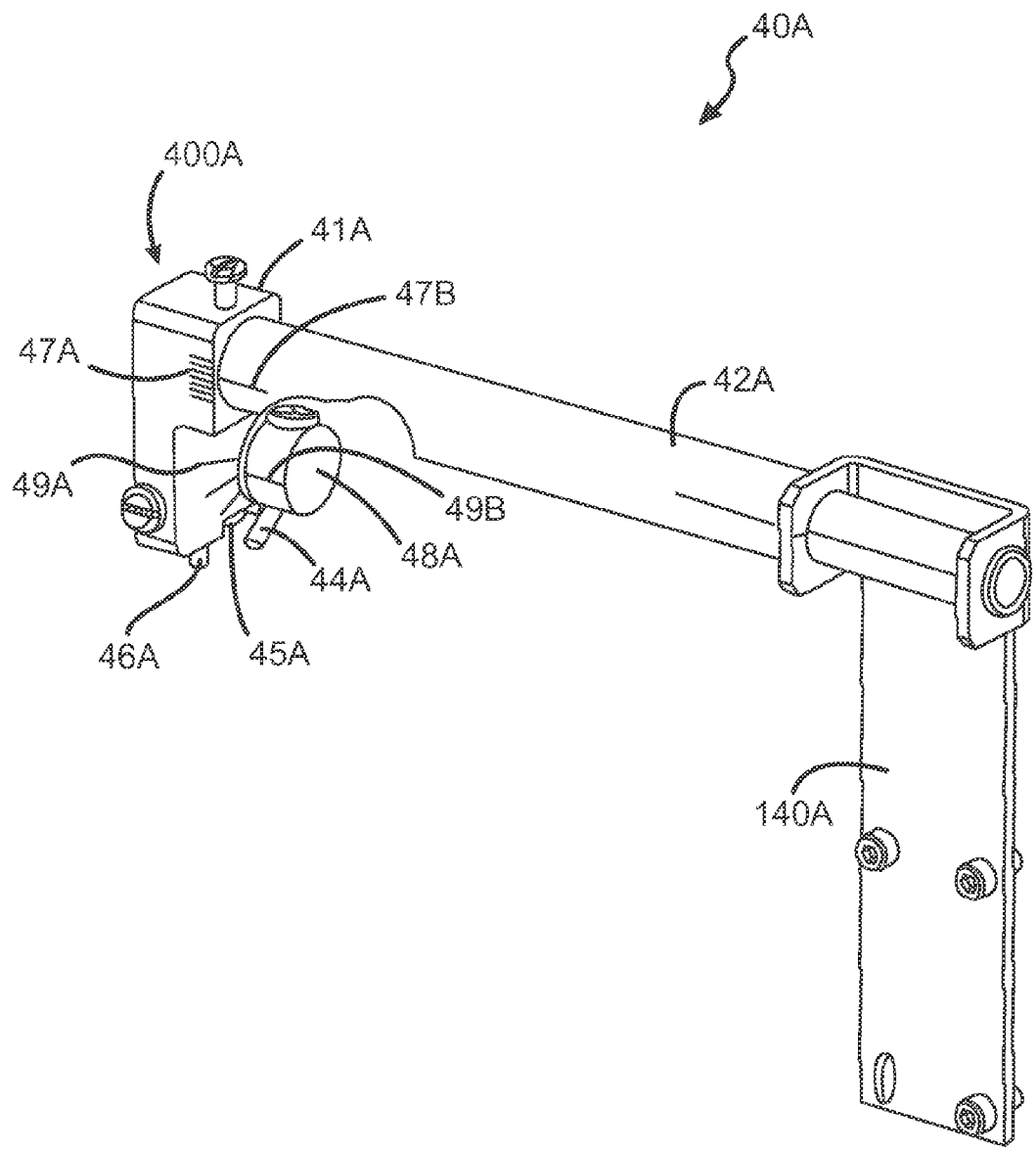
FIG. 11 is a perspective view of an alternative embodiment of a pivotable dryer assembly according to an embodiment of the present invention, the dryer assembly comprising indicia for orienting a pivotable DIW nozzle and indicia for orienting the dryer assembly with respect to a support arm.

Referring now to FIG. 11, a second embodiment of a drying assembly 40A that can be used in the inventive drying system 100 is illustrated. While the dispensing nozzles 44A-46A do not have the preferred aligned arrangement on the housing 41A as discussed above, the drying assembly 40A can be modified to have this arrangement. The drying assembly 40A, however, importantly contains indicia 47A-B, 49A-B for reliably determining the exact angle of orientation of the DIW dispensing nozzle 44A and the head portion 400A with respect to the surface of a substrate. If desired, indicia similar to that of indicia 47A-B, 49A-B can be added to the drying assembly 40 of FIGS. 9 and 10. The importance and functioning of the indicia 47A-B, 49A-B will now be described in detail.

As mentioned above, the angle at which the DIW is dispensed onto the substrate during a Rotagoni drying process has been discovered to affect the success of the drying process. Thus, it is important that the angle at which the DIW is dispensed onto the substrate be precisely set and maintained during the drying process. Moreover, it is important that the angle at which the DIW is dispensed onto a substrate is both consistent and predictable from system to system. Indicia marks 49A, 49B are used to set and indicate the angle at which the DIW dispensing nozzle 44A is oriented relative to the surface of the substrate and to the housing 41A. Indicia marks 49A are located on the housing 41A in a circumferentially spaced pattern adjacent the knob 48A, which is pivotably connected to the housing 41A. More specifically, the indicia marks 49A are circumferentially spaced lines, equidistant relative to one another and adjacent to the knob 48A. A corresponding indicia mark 49B (which in one embodiment is in the form of a line) is provided on the knob 48A. The indicia mark 49B can be positioned/aligned at a desired location relative to the indicia marks 49A on the housing 41A by pivoting the knob 48A. Through their relation with the indicia mark 49B, the indicia marks 49A on the housing 41A serve as points of reference for the rotational position of the knob 48A, and thus the angle of orientation of the DIW dispensing nozzle 44A. As a result, the DIW dispensing nozzle 44A can be adjusted to a range of dispensing angles relative to the housing 41A and the surface of the substrate. The range of rotation of the DIW dispensing nozzle 44A can be about 90 degrees to the left of and about 90 degrees to the right of a vertical line perpendicular to the plane formed by the substrate surface. In a preferred embodiment, the DIW dispensing nozzle 44A is oriented at a 45 degree angle in relation to the substrate surface. The use of the indicia 49A, 49B allow the DIW dispensing angle to be duplicated in all drying systems so that every Rotagoni drying process will behave in a more predictable manner.

Similarly, indicia marks 47A,47B can be used to set and determine the angle of the head portion 400A (and housing 41A) on the support arm 42A, which in turn sets the angle at which the N$_2$/IPA dispensing nozzles 45A, 46A dispense the N$_2$/IPA vapor onto the substrate. Indicia marks 47A,47B work to control the dispensing angle of the N$_2$/IPA vapor in a manner similar to that discussed above with respect to indicia marks 49A, 49B for the DIW. Adjustment of the angle of the housing 41A (and thus the N$_2$/IPA dispensing nozzles 45A, 46A) is achieved by pivoting the entire housing 41A about the support arm 42A. The housing 41A is pivotably connected to the support arm 42A. The indicia 47A are spaced lines located on the housing 41A adjacent to the arm 42A. The corresponding indicia 47B is located on the arm 42A. The use of the indicia 47A, 47B allow the dispensing angle of the N$_2$/IPA dispensing nozzles 45A, 46A to be duplicated in all drying systems so that every Rotagoni drying process will behave in a more predictable manner.

Set screws are provided to hold the knob 48A and the head portion 41A in the selected angle of orientation. However, other means can be used, such as a tight fit assembly, a threaded assembly, a snap-fit assembly, or click-fit assembly. Moreover, while the indicia marks 47A, 47B, 49A, 49B are illustrated as markings on the relevant surfaces of the dryer assembly 40A, other indicia can be used, including without limitation lines, dashes or the like, indents, grooves or raised surfaces, notches, etc.

Figure 12:
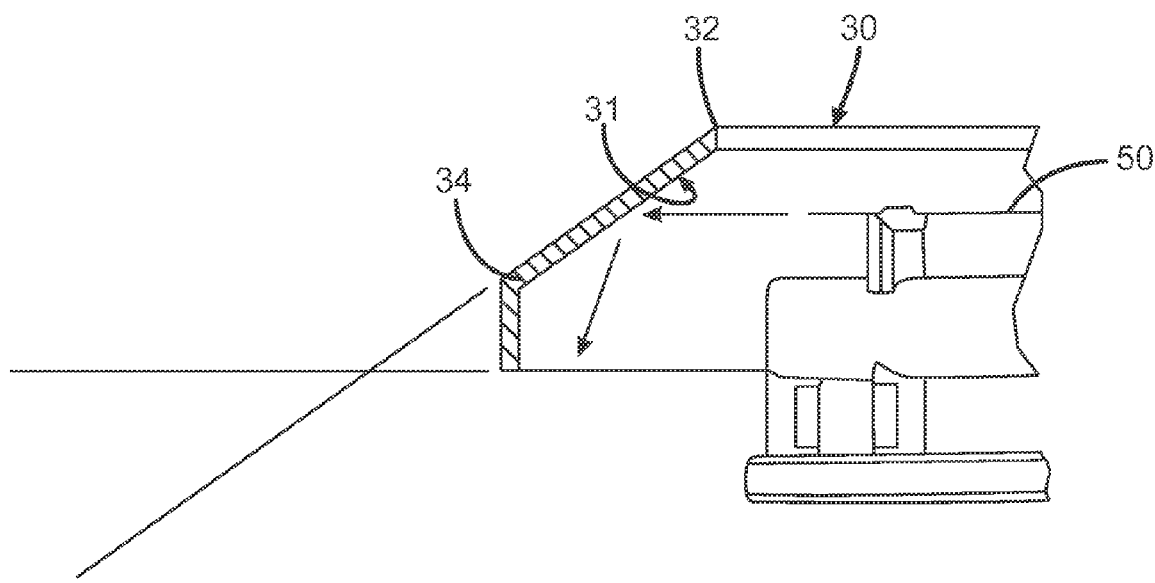
FIG. 12 is a cross-sectional view of a splash guard according to an embodiment of the present invention that can be used with the drying system of FIG. 7.
Figure 13:
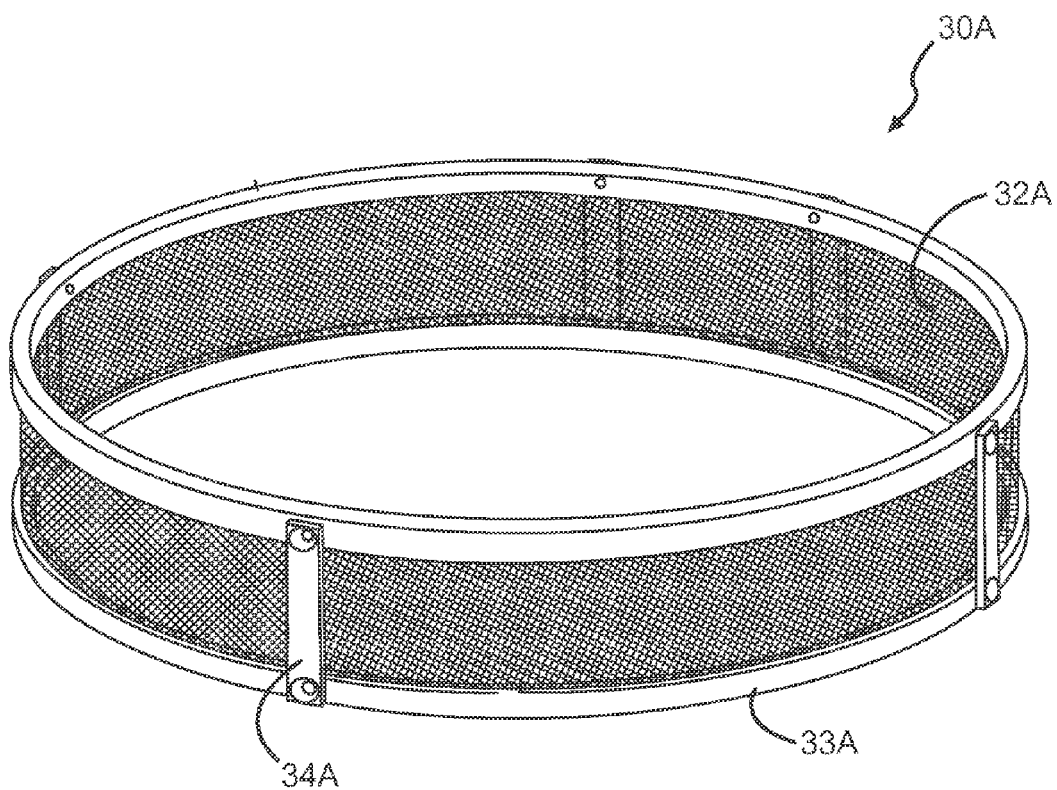
FIG. 13 is a perspective view of a splash-guard according an alternative embodiment of the present invention that can be used with the drying system of FIG. 7.

Referring now to FIG. 12, a splash guard 30 according to an embodiment of the present invention is illustrated. The splash guard 30 can be incorporated into the drying system 100 (as illustrated in FIG. 7) to circumferentially surround the substrate 50 as is well known in the art. When so incorporated, the splash guard 30 circumferentially surrounds the edge of the substrate 50 in a manner that helps minimize process fluids from splashing back onto the surface after being flung off the rotating substrate 50 by centrifugal forces. Generally, the splash guard 30 comprises an inner surface 31 that surrounds and faces the edge of the substrate 50 in a spaced relation. The inner surface 31 of the splash guard 30 is angled downwardly at a predetermined angle relative to the plane formed by the stop surface of the substrate 50. In one embodiment, the angle is between 10 and 60 degrees. The splash guard 30 is configured so that it extends from a first point 32 that is at an elevation higher than the substrate 50 to a second point 34 that is at an elevation lower than the substrate 50. As a result, process fluids flung from the top and bottom surfaces of the rotating substrate 50 are deflected downward and away from the substrate 50 when such process fluids impact the angled inner surface 31 of the splash guard 30.

As discussed above, it has been discovered that prior art splash guards tend to allow fluid droplets to adhere to the splash guard. When later fluid droplets impact against the inner surface of the splash guard, the later fluid droplets impact upon the adhered fluid droplets. As a result of the subsequent impact between fluid droplets, a spray of smaller fluid droplets is created. The spray can deflect in numerous directions (e.g., downwards, upwards, sideways), where some of the smaller fluid droplets contaminate the substrate. In order to eliminate or reduce this problem, the splash guard 30 is constructed so that the inner surface 31 is formed of a highly hydrophobic material. In one embodiment, the splash guard 30 can be constructed entirely of the hydrophobic material. In another embodiment, the splash guard 30 is constructed of a non-hydrophobic material and is coated, in whole or in part, with a hydrophobic material. In such an embodiment, it is preferred that at least the inner surface 31 be made of the hydrophobic material.

By manufacturing the splash guard 30 from hydrophobic material or by coating the splash guard 30 in whole or in part with a hydrophobic material, splash-back can be further minimized because water droplets will tend not adhere to the inner surface 31 of the splash guard 30. Minimizing the number of fluid droplets adhering to the splash guard 30 will minimize the chance of the spray mentioned previously, which would minimize splash-back.

The concept of using a hydrophobic material for the splash guard can be incorporated into almost any type of splashguard, independent of its exact structure. For example, a mesh-type splash guard 30A, such as that shown in FIG. 12 can be made of a hydrophobic material. The mesh-type splash guard 30A comprises a frame 33A, at least one supporting frame member 34A and a mesh portion 32A. The mesh portion 32A preferably comprises a plurality of strands arranged in a crossing fashion (e.g. perpendicularly crossing) to form a grid of rectangular openings. The mesh portion 32A can be affixed to the frame 33A or the frame and mesh may be unitary. Splash guard 30A can be constructed entirely of a hydrophobic material or can be coated, in whole or in part, with a hydrophobic material. Examples of suitable hydrophobic materials include polypropylene, Teflon®, or any other suitably rigid hydrophobic plastic. Although shown as a cylinder, the mesh-type splash guard 30A may have a variety of shapes including but not limited to splash guard 30 comprising an angled inner surface 31. An example of such a splash guard is disclosed in U.S. Pat. No. 6,928,751 to Hosack et al., issued on Aug. 15, 2005, the entirety of which is hereby incorporated by reference.

A method of drying a rotating substrate according to an embodiment of the present invention will now be described with reference to FIGS. 14-21. For ease of discussion, the method will be described as being carried out on the drying system 100 of FIGS. 7-13. However, the method is in no way limited by the inventive structure of the drying system 100. It will clear to those skilled in the art that key aspects/parameters of the inventive method can even be carried out on prior art drying systems. Moreover, the method can be fully automated by the controller 200. However, in order to avoid redundancy and a discussion of well-known plumbing and mechanical controls, the automation of the such controls will be omitted.

Figure 14:
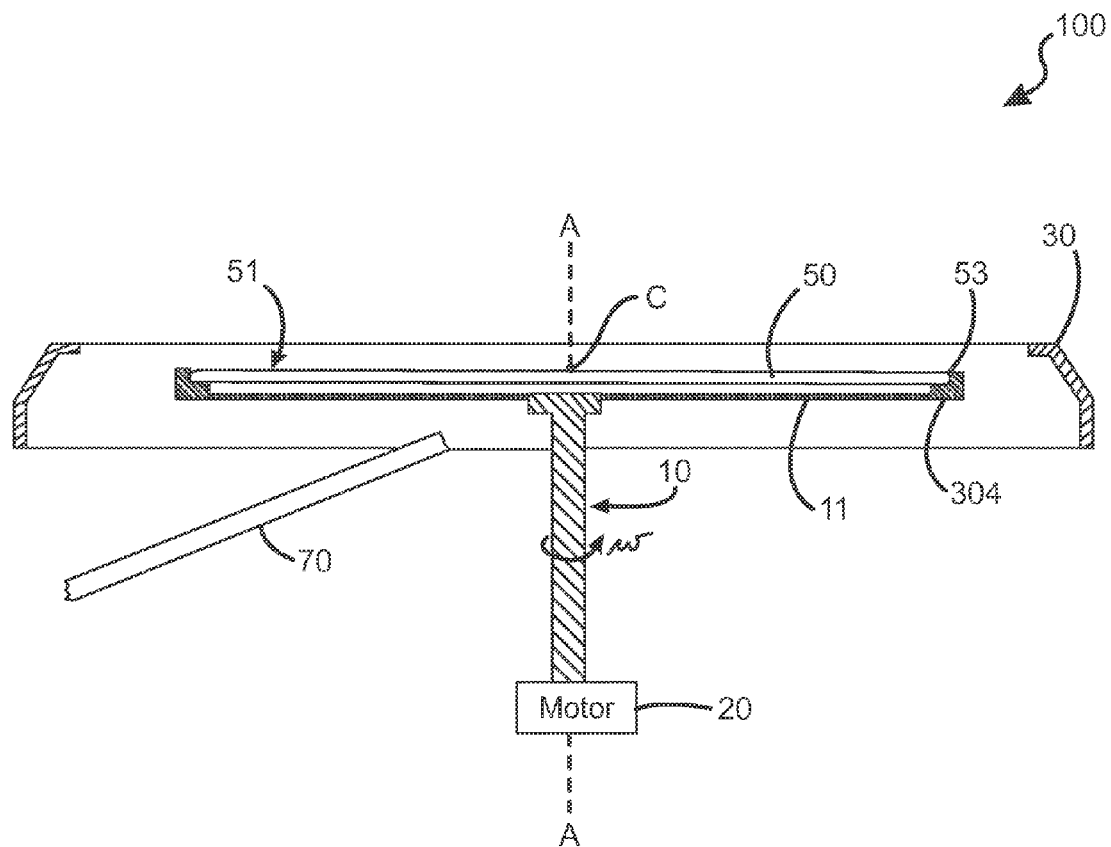
FIG. 14 is a schematic of an embodiment of the drying system of FIG. 7 adapted to carry out a method of drying a substrate according to an embodiment of the present invention.

Referring first to FIG. 14, a rotatable support 10 is provided in a gaseous atmosphere. The rotatable support 10 is operably connected to a servomotor 20. The support 10 comprises a ring-like structure 12 that is connected to the tubular shaft by a plurality of spokes 11. The tubular shaft is operably connected at its lower end to the rotatable support servomotor 20, which rotates the chuck at a predetermined rotational speed ω. A substrate 50 is first positioned on the support 10 in the gaseous atmosphere. The support 10 supports the substrate 50 in a substantially horizontal orientation by contacting only the edge 53 of the substrate 50 with ring-like structure 12. Once the substrate 50 is positioned on the support 10 (and properly secured in place), the support 10 is rotated by the motor 20 at the rotational speed ω, thereby rotating the substrate 50 in a corresponding manner about a rotational center point C. Vertical axis A-A passes through the rotational center point C.

Preferably, the substrate 50 is rotating at a constant rotational speed ω. In one embodiment, the rotational speed ω is between around 300 to 500 rotations per minute (rpm). In another embodiment, the rotational speed ω is between 1000 and 1800 rpm. However, the rotational speed is not limiting of the present invention and can be practiced at speeds considerably lower than 300 rpm or higher 1800 rpm. A lower rpm can minimize the air turbulence within the dryer process chamber. A higher rpm, however, has several advantages over a lower rpm, as discussed in more detail below.

Figure 15:
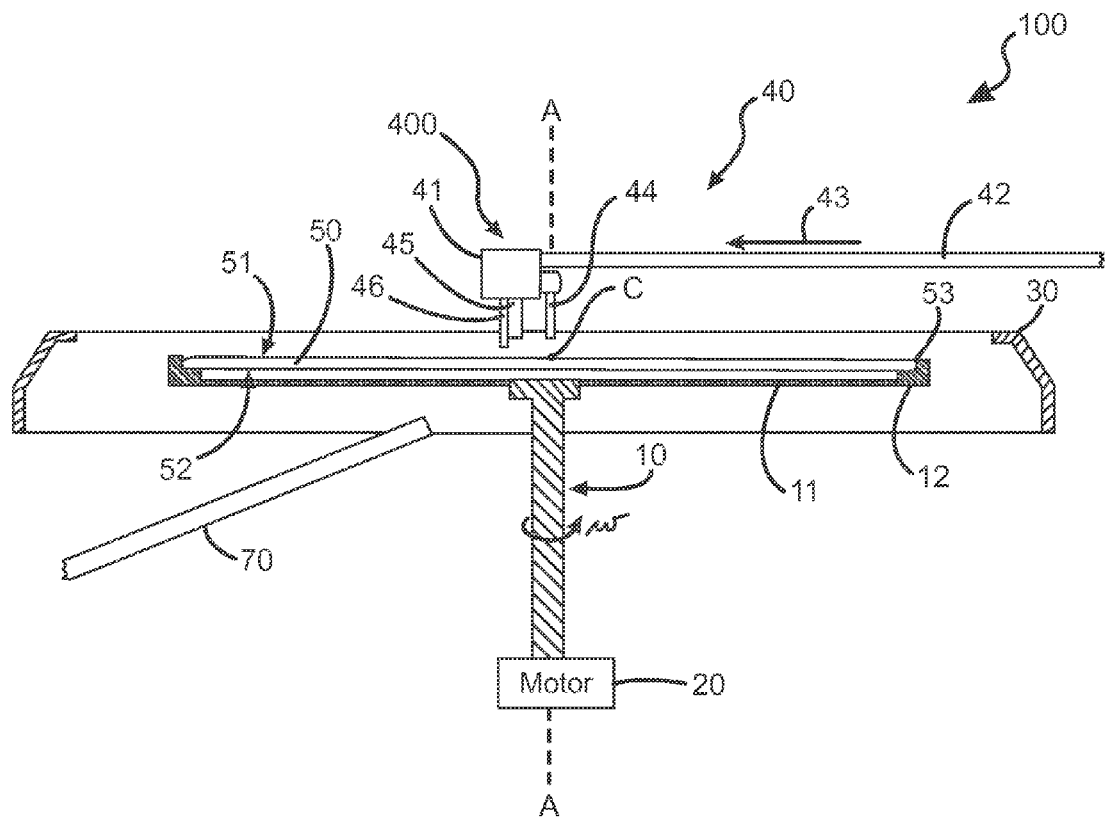
FIG. 15 is a schematic of the drying system of FIG. 14 wherein the dryer assembly is positioned in a starting position above a substrate according to an embodiment of the present invention.

Referring now to FIG. 15, the dryer assembly 40 is illustrated in a start-up position at the beginning of a Rotagoni drying process. In order to get the dryer assembly 40 in the start-up position, the dryer assembly 40 is moved right to left along the direction indicated by arrow 43. More specifically, the dryer assembly 40 is moved from a retracted position in an inwardly radial direction toward the rotational center point C of the substrate 50. This movement occurs until the dryer assembly 40 reaches a position where the DIW dispensing nozzle 44 is positioned substantially above the rotational center point C of the substrate 50 and the $N_2$/IPA dispensing nozzles 45, 46 overshoot the rotational center point C. The movement of the dryer assembly 40 is then stopped. Preferably, when in the start-up position, the first $N_2$/IPA dispensing nozzle 45 is located about 3-6 mm beyond the rotational center point C of the substrate 50. More preferably, the first $N_2$/IPA dispensing nozzle 45 is about 4-5 mm beyond the rotational center point C. Naturally, the second $N_2$/IPA dispensing nozzle 46 is located further away from the rotational center point C than the first $N_2$/IPA dispensing nozzle 45. It should be noted that while the DIW dispensing nozzle 44 is illustrated as being positioned directly above the rotational center point C of the substrate 50 when in the start-up position, it is possible for the DIW dispensing nozzle 44 to be located in an off-center position so long as the DIW dispensing nozzle 44 can dispense the DIW onto or very near the rotational center point C of the substrate.

Figure 16:
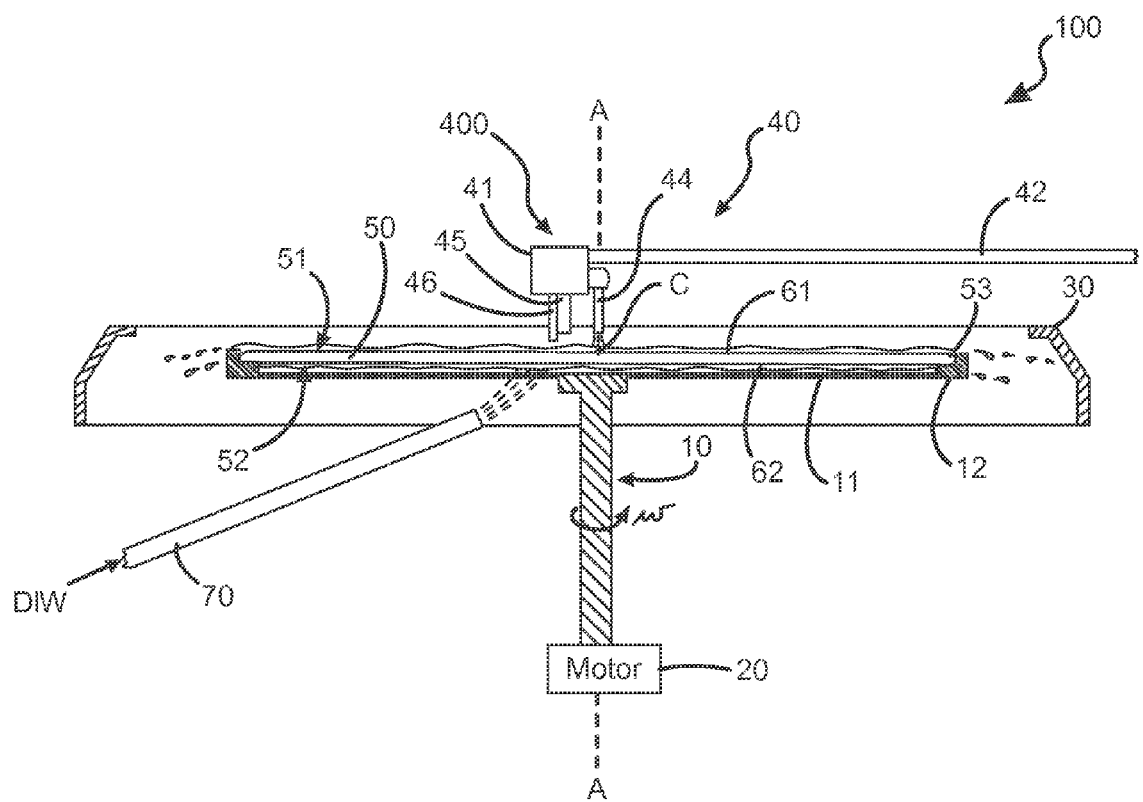
FIG. 16 is a schematic of the drying system of FIG. 14 wherein a film of DIW has been applied to both the front and back sides of the substrate.

Referring now to FIG. 16, the DIW dispensing nozzle 44 and the backside dispensing nozzle 70 are then activated, thereby applying a layer/film of DIW to the top and bottom surfaces 51, 52 of the substrate 50. The layers/films of DIW cover the entirety of the top and bottom surfaces 51, 52 of the substrate 50. The layers/films of DIW are preferably thin films.

Figure 17:
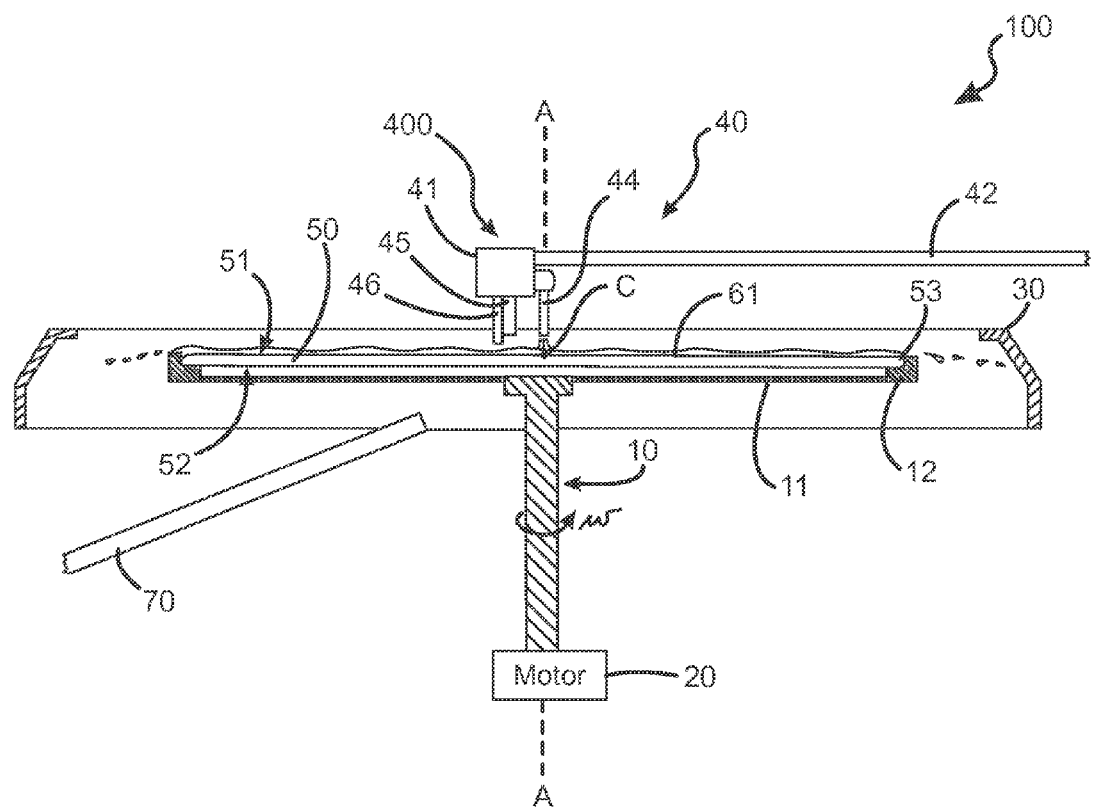
FIG. 17 is a schematic of the drying system of FIG. 14 wherein the application of DIW to the backside of the substrate is discontinued and the film of DIW is maintained on the front side of the substrate.

Referring to FIG. 17, the supply of DIW to the backside DIW dispensing nozzle 70 is then stopped, resulting in the supply of the DIW to the bottom surface 52 of the substrate 50 also being stopped. As the substrate 50 continues to rotate at the speed ω, the layer/film of DIW is then spun off the bottom surface 52 of the substrate 50 due to the centrifugal forces imparted on the DIW film from the rotational motion. If desired, the substrate 50 can be rotated at a higher RPM at this time. Concurrently during this backside drying, the layer/film of DIW is sufficiently maintained on the front surface 51 of the substrate 50 by continuing to dispense DIW though the DIW dispensing nozzle 44. Although the force of the spinning substrate 50 can spray and scatter fluid droplets onto the front surface 51 of the substrate 50 during this backside drying, the front surface 51 of the substrate 50 is protected from watermarks by the film/layer of DIW maintained on the entirety of the front surface 51. The dryer assembly 40 is maintained in the start-up position during this procedure. Once the back surface 52 is dry, the Rotagoni drying steps can then begin on the front surface 51 of the substrate 50.

Figure 18:
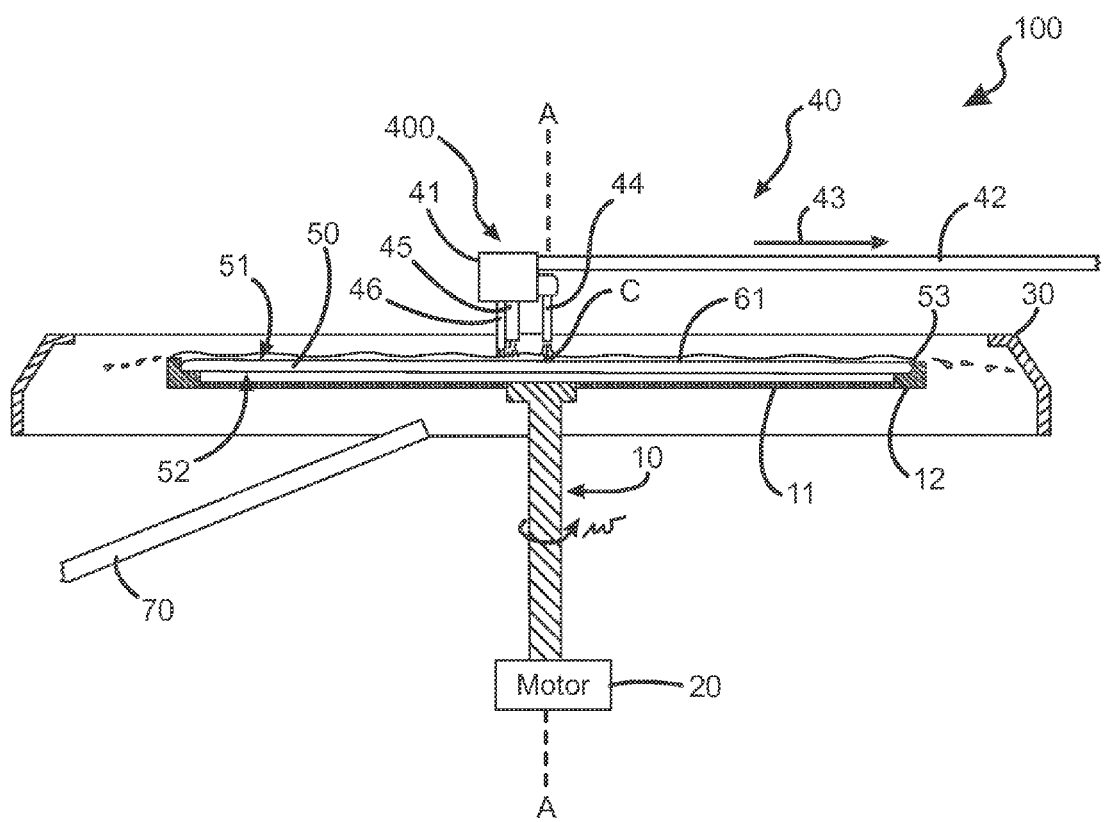
FIG. 18 is a schematic of the drying system of FIG. 14 wherein the $N_2$/IPA drying vapor is applied to an off-center position on the front side of the substrate while the film of DIW is maintained across the entire front side of the substrate.

Referring now to FIG. 18, once the bottom surface 52 of the substrate 50 is entirely dry from the spinning motion, the first and second $N_2$/IPA dispensing nozzles 45, 46 are activated, thereby flowing $N_2$/IPA vapor to the off-center location on the top surface 51 of the substrate 50. As discussed above, the flow of $N_2$/IPA vapor is initiated by the gradual opening of the proportional valves 85, 86 (FIG. 7) in order to eliminate any pressure spikes that may exist in the lines. The first $N_2$/IPA dispensing nozzle 45 and the second $N_2$/IPA dispensing nozzle 46 can be opened concurrently or separately. In one embodiment, either one of the first or second $N_2$/IPA dispensing nozzles 45, 46 is activated, then as the dryer assembly 40 is then moved in the left to right direction, the other of the first or second $N_2$/IPA dispensing nozzles 45, 46. Preferably, the later activated first or second $N_2$/IPA dispensing nozzles 45, 46 is opened between 4-8 seconds after the initial $N_2$/IPA dispensing nozzle is activated.

By positioning and opening the N$_2$/IPA dispensing nozzles 45, 46 at an off-center position while supplying the DIW to the rotational center C, the blowing/evaporative force caused by the application of the N$_2$/IPA vapor is not sufficient to overcome the DIW application. Thus, a dry spot (such as that illustrated in FIGS. 3 and 4) is not created on the substrate 50. Instead the application of the DIW from the dispensing nozzle 44 maintains a continuous film/layer of DIW across the entire top surface 51 of the substrate 50 because the stream of DIW flowing from the rotational center point C towards the N$_2$/IPA vapor impact point on the substrate 50 aids in preventing blowing and evaporation.

For substrates with hydrophobic surfaces, a substantial amount of DIW should be dispensed on the substrate 50. If not, the substrate 50 may not be isolated from the air and the DIW can evaporate and form watermarks. As such, in one embodiment, for a 200 mm substrate 50, the DIW flow rate associated with the DIW dispensing nozzle 44 to the front surface 51 of the substrate 50 should be between about 140~200 ml/min. In another embodiment, for a 300 mm substrate 50, the DIW flow rate associated with the DIW dispensing nozzle 44 to the front surface 51 of the substrate 50 should be between about 250~350 ml/min. Using these flow rates, the blowing/evaporative force caused by the application of the N$_2$/IPA vapor to the off-center location is not sufficient to overcome the DIW application. However, the current invention is not so limited and lower or higher flow rates can be used.

Once the N$_2$/IPA dispensing nozzles 45, 46 have been activated, the dryer assembly 40 is then moved in the left to right direction indicated by the arrow 43 of FIG. 18 at a desired rate/velocity. During the movement along direction 43, the nozzles 44-46 move in the preferred alignment discussed above with respect to FIGS. 9 and 10. In short, the N$_2$/IPA dispensing nozzles 45, 46 are symmetrically aligned along an axis that is substantially parallel to the linear path of movement.

As the dryer assembly 40 begins to move from the start-up position of FIG. 18 in the direction indicated by the arrow 43, the first N$_2$/IPA dispensing nozzle 45 and second N$_2$/IPA dispensing nozzle 46 move towards the rotational center point C of the substrate 50 while the DIW dispensing nozzle 44 moves in a radial direction outward from the rotational center point C of the substrate 50. The dryer assembly 40 continues to move in the direction 43 until the first and/or second N$_2$/IPA dispensing nozzles 45, 46 reach a position substantially above the rotational center point C. This position is shown in FIG. 19.

Figure 19:
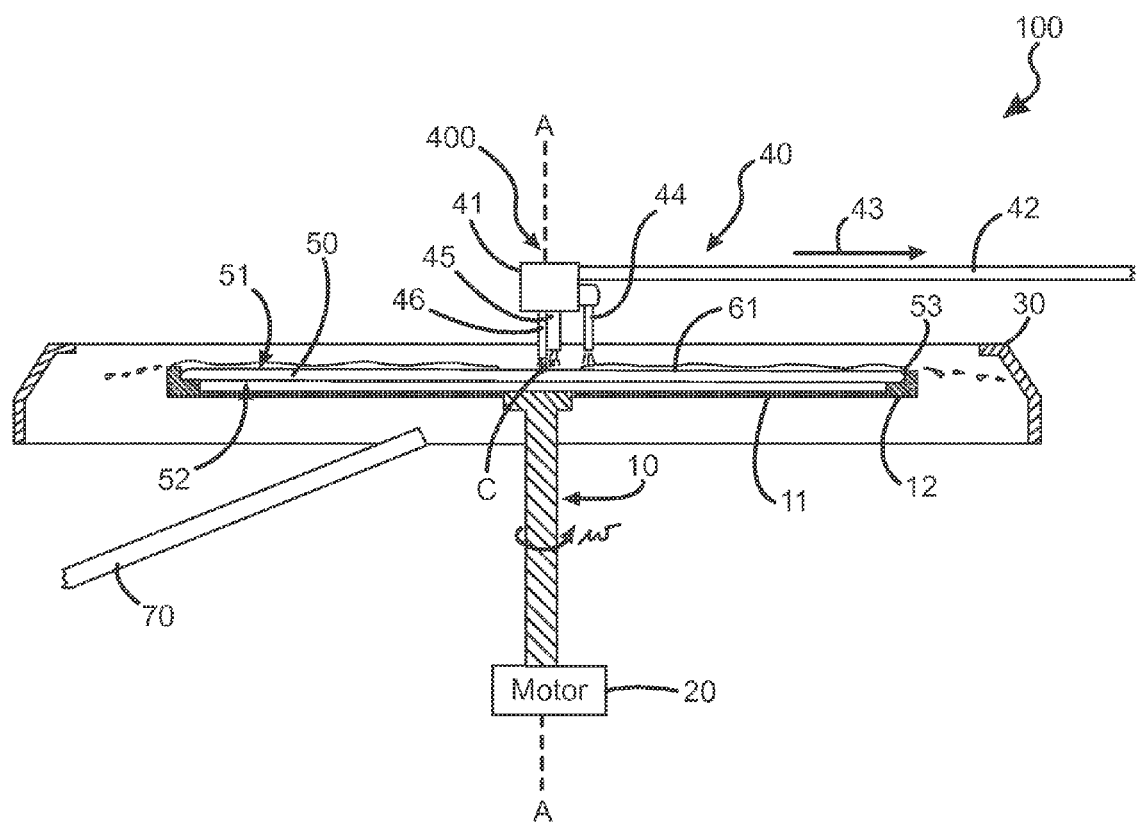
FIG. 19 is a schematic of the drying system of FIG. 14 wherein the dryer assembly has translated toward the right edge of the substrate so that the N$_2$/IPA nozzle is positioned above the rotational center point of the substrate, resulting in a center region of the substrate being dried by STG.

Referring now to FIG. 19, the dryer assembly 40 is illustrated in an initial drying position where the N$_2$/IPA dispensing nozzles 45, 46 are located above the rotational center point C of the substrate 50 while the DIW dispensing nozzle 44 is off-center. At this point, the N$_2$/IPA dispensing nozzles 45, 46 are apply N$_2$/IPA vapor to the rotational center point C while the DIW is being applied to an off-center location. At this point, the Rotagoni drying begins, thereby removing the layer/film of DIW from the center region of the substrate 50 by STG phenomena rather than sudden drying and/or evaporation.

The dryer assembly 40 continues to move in the direction 43 radially outwards from the rotational center point C toward the edge 53 of the substrate 50 at the desired rate/velocity. The rate/velocity of the dryer assembly 40 can either be constant or varied. Moreover, while the path of movement of the dryer assembly 43 is preferably linear in nature, other shaped paths can be used, such as curved, sinusoidal, etc. During this movement, the DIW dispenser 44 leads the N$_2$/IPA dispensing nozzles 45, 46 so that the point at which the DIW contacts the surface 51 of the substrate 50 leads the point at which the N$_2$/IPA vapor contacts the surface 51 of the substrate 50. The dryer assembly 40 continues to move toward the edge 53 of the substrate 50 (with both the N$_2$/IPA vapor and DIW being dispensed) until it reaches a position where the DIW dispenser 44 is dispensing DIW to at or near the edge 53 of the substrate, as shown in FIG. 20.

Figure 20:
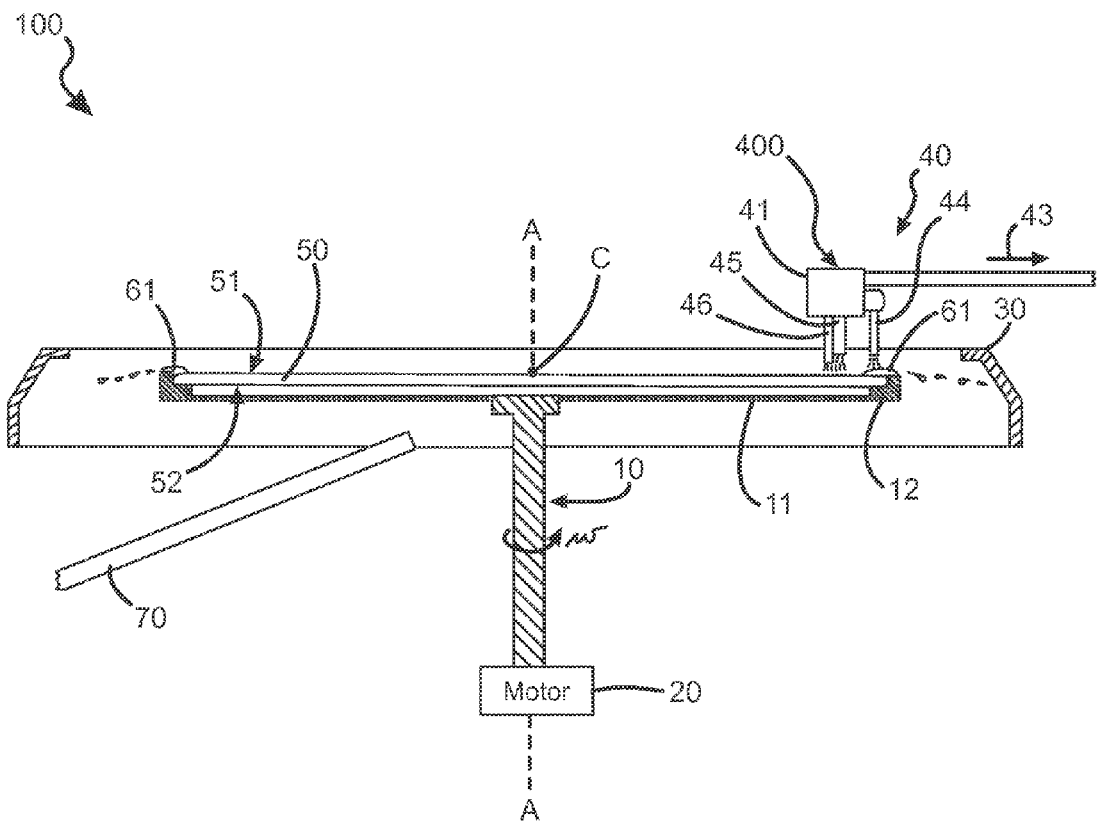
FIG. 20 is a schematic of the drying system of FIG. 14 wherein the dryer assembly has translated toward the edge of the substrate so that the DIW nozzle is above the edge of the substrate, and wherein a majority of the substrate has been dried by STG.
Figure 21:
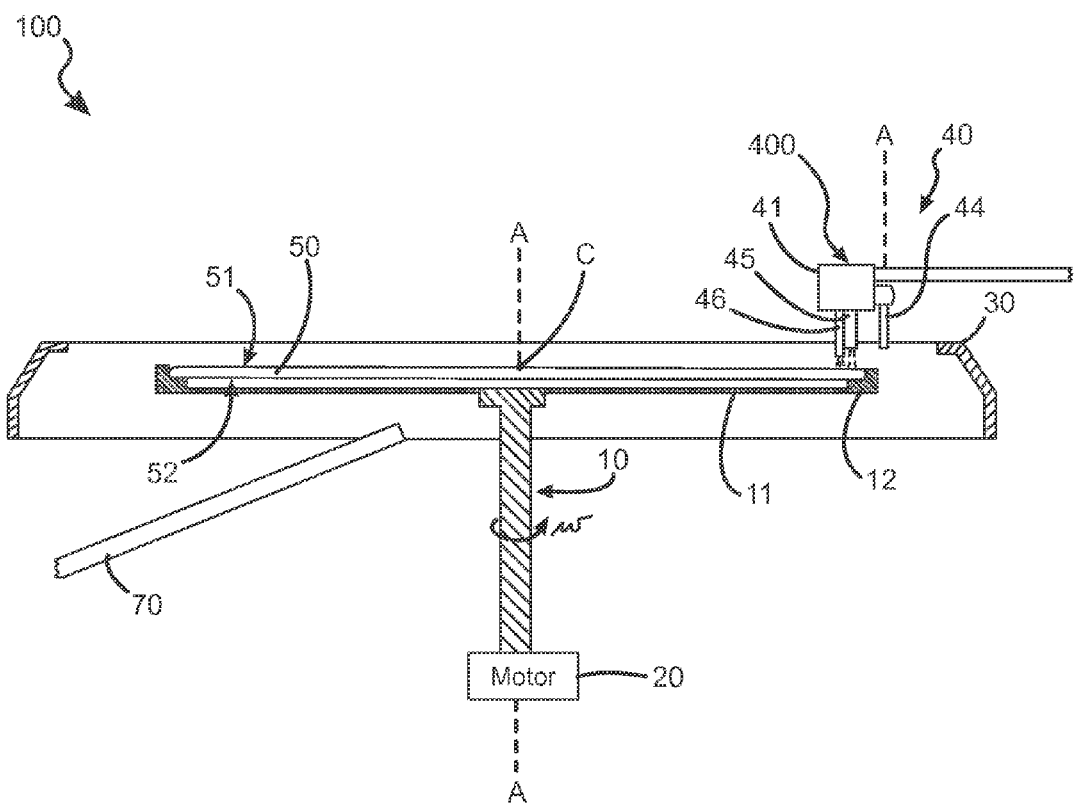
FIG. 21 is a schematic of the drying system of FIG. 14 wherein the dryer assembly has translated to the edge of the substrate so that the N$_2$/IPA nozzle is maintained in an orientation above the edge of the substrate, and wherein the entirety of the front side of the substrate has been dried by STG.

Referring now to FIG. 20, when the dryer assembly 40 reaches a position where the DIW nozzle 44 is dispensing the DIW at or near the edge of the substrate 50, the movement of the dryer assembly 40 is stopped. This position is held for a period of time while the DIW dispensing nozzle 44 is deactivated, thereby discontinuing the supply of the DIW to the substrate 50 (as shown in FIG. 21). However, the application of the N$_2$/IPA vapor via the nozzles 45,46 is continued for a predetermined period of time thereafter. In one embodiment, the assembly 40 continues the application of N$_2$/IPA vapor for about 1 to 10 seconds after the DIW water supply is stopped, and more preferably between 1 to 5 seconds. By keeping the two N$_2$/IPA dispensing nozzles 45, 46 open for a prolonged period of time near the edge 53 of the substrate 50, watermarks or strips were not observed using a high speed camera, which were believed to be caused by the lack of N$_2$/IPA vapor supplied to the substrate in prior art systems/methods.

As stated above, in one embodiment, the Rotagoni dry process of the current invention is done at relatively low rotational speeds, for example, 300-500 rpm. However, in one preferred embodiment, the rotational speed is between 1000 and 1800 rpm, which is substantially higher than 300-500 rpm. This higher rotational speed has been discovered to confer several advantages.

The key forces in facilitating Rotagoni drying are the STG phenomena and centrifugal forces. At higher rpms, such as 1000 to 1800 rpm, the thickness of the DIW layer/film on the surface of the substrate 50 becomes thinner and, thus, the effective concentration of the IPA at the N$_2$/IPA vapor-DIW border increases. As a result, higher STG forces can be expected at the N$_2$/IPA vapor-DIW border due to the higher effective concentration of IPA. Furthermore, greater centrifugal forces are effectuated to the DIW by the higher rpm. With greater centrifugal force, the DIW film can be pulled away from the edge portion of the substrate 50 with greater force, which is advantageous in aiding the drying process and minimizing evaporation/watermarks.

The increased rotational speed of the substrate 50, in turn, enables the dryer assembly to be moved across the substrate 50 surface at a greater velocity/rate. In one embodiment, the dryer assembly 40 can move at 5 mm/sec with the substrate 50 spinning at 300 rpm in order to achieve acceptable drying. However, in another embodiment, the dryer assembly 40 can move at 15 mm/sec with the substrate spinning at 1500 rpm in order to achieve acceptable drying. Traditionally, Rotagoni drying of the front surface of the substrate 50 required longer process times than spin drying of the backside of the substrate 50. However, the Rotagoni drying process time can be reduced drastically with the disclosed higher rpm drying process and the increased speed of the dryer assembly 40.

Yet another advantage of a higher drying rpm relates to splash-back. With a higher rotational rpm, a fluid droplet on the surface of the substrate 50 that is projected off the substrate due to centrifugal forces has more speed and is generally smaller in size relative to a droplet associated with lower rotational rpm. As a result, DIW or fluid droplets that tend to attach to the surface of splash guard are likewise smaller in size. This smaller sized droplet generates less splash back when it crashes/impact with fluid droplets on the surface of the splash guard.

Although the previous embodiment has been described in terms of the use of $N_2$/IPA (nitrogen gas and isopropyl alcohol vapor) as the drying fluid, other suitable liquids, gases, or combinations thereof can be used. Similarly, the invention is not limited to the use of DIW as the rinsing fluid and those skilled in the art will appreciate that other process fluids can be used, such as $DIO_3$, etc.

While a number of embodiments of the current invention have been described and illustrated in detail, various alternatives and modifications will become readily apparent to those skilled in the art without departing from the spirit and scope of the invention.

What is claimed is:

1. A system for drying a surface of a substrate comprising:
   a rotary support for supporting a substrate; and
   an assembly comprising a first dispenser, a second dispenser, and a third dispenser, the assembly positioned above the surface of the substrate, the second and third dispensers positioned on the assembly adjacent to and in contact with one another and spaced from the first dispenser, the second dispenser having an opening that is larger than an opening of the third dispenser, and the second dispenser being located between the first and third dispensers; and
   means for translating the assembly generally parallel to the surface of the substrate.

2. The system of claim 1 wherein the opening of the second dispenser is approximately twice the size of the opening of the third dispenser.

3. The system of claim 1 further comprising:
   a source of liquid operably coupled to the first dispenser; and
   a source of drying fluid operably coupled to the second and third dispensers.

4. The system of claim 1 wherein the opening of the second dispenser is located at a first distance from the surface of the substrate while the opening of the third dispenser is located at a second distance from the surface of the substrate, the first distance being greater than the second distance.

5. The system of claim 1 wherein the rotary support is adapted to rotate about an axis, and wherein the opening of the second dispenser is located at a first radial distance from the axis while the opening of the third dispenser is located at a second radial distance from the axis, the first radial distance being greater than the second radial distance.

6. The system of claim 5 wherein an opening of the first dispenser is located at a third radial distance from the axis, the third radial distance being greater than the first radial distance.

7. The system of claim 1 wherein the third dispenser follows the second dispenser during translation of the assembly during a substrate drying sequence.

* * * * *